US008082360B2

(12) United States Patent
Ogura

(10) Patent No.: US 8,082,360 B2
(45) Date of Patent: *Dec. 20, 2011

(54) ASSOCIATIVE MEMORY HAVING A MASK FUNCTION FOR USE IN A NETWORK DEVICE

(75) Inventor: Naoyuki Ogura, Yokohama (JP)

(73) Assignee: Terminus Technology Limited (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/836,792

(22) Filed: Jul. 15, 2010

(65) Prior Publication Data

US 2011/0066755 A1    Mar. 17, 2011

Related U.S. Application Data

(62) Division of application No. 11/975,100, filed on Oct. 17, 2007, now Pat. No. 7,761,599, which is a division of application No. 10/497,570, filed as application No. PCT/JP01/10792 on Dec. 10, 2001, now Pat. No. 7,287,120.

(51) Int. Cl.
*G06F 15/16* (2006.01)
(52) U.S. Cl. .................... 709/232; 709/245; 711/108
(58) Field of Classification Search .............. 709/232, 709/245; 711/108; 365/49.17
See application file for complete search history.

(56) References Cited

U.S. PATENT DOCUMENTS

| 4,044,338 | A | 8/1977 | Wolf |
| 6,295,576 | B1 | 9/2001 | Ogura et al. |
| 6,539,455 | B1* | 3/2003 | Khanna et al. ............ 711/108 |
| 6,543,016 | B1* | 4/2003 | Lewandowski et al. ...... 711/108 |
| 6,665,297 | B1 | 12/2003 | Hariguchi et al. |
| 6,983,345 | B2 | 1/2006 | Lapir et al. |
| 7,200,712 | B2* | 4/2007 | Ogura ....................... 711/108 |
| 7,287,120 | B2* | 10/2007 | Ogura ....................... 711/108 |
| 7,761,599 | B2* | 7/2010 | Ogura ....................... 709/245 |
| 2002/0161969 | A1* | 10/2002 | Nataraj et al. ............ 711/108 |

FOREIGN PATENT DOCUMENTS

| JP | 2000-322892 | 11/2000 |
| JP | 2001-357679 | 12/2001 |
| WO | WO 97/13345 | 4/1997 |

OTHER PUBLICATIONS

International search report for PCT application No. PCT/JP01/10792, dated Mar. 12, 2002 (In Japanese).

* cited by examiner

*Primary Examiner* — Ramy M Osman
(74) *Attorney, Agent, or Firm* — Husch Blackwell LLP

(57) ABSTRACT

An associative memory 4 for primary searching operation of an associative memory 23 supplies a valid state to a primary match line 13 corresponding to storage data coincident with search data 10 taking mask information into account, and supplies a value obtained from a result of a logical sum operation (an OR operation), with a valid state for the storage data as true, of all said coincident storage data to a counting means 25 as intermediate data 15. The counting means 25 supplies a result of an operation to the intermediate data 15 for counting the number of bits in an invalid state for the storage data to an associative memory 3 for secondary searching operations as secondary search data 19. Among secondary storage data obtained by carrying out said operation to said storage data, the associative memory 3 for secondary searching operation supplies a result of carrying out the searching operation of the secondary search data 19 to a secondary match line 21. The invalidation means 22 changes a secondary match line 21 corresponding to a primary match line 13 in an invalid state into an invalid state to supply to an external source as a match line 11.

6 Claims, 16 Drawing Sheets

ASSOCIATIVE MEMORY HAVING A MASK FUNCTION FOR USE IN A NETWORK DEVICE

This application is a divisional of U.S. application Ser. No. 11/975,100 filed Oct. 17, 2007 which is a divisional of U.S. application Ser. No. 10/497,570 filed Jun. 6, 2004 (now U.S. Pat. No. 7,287,120 issued Oct. 23, 2007) which is the national stage under 35 USC 371 of PCT/JP01/10792 filed Dec. 10, 2001.

BACKGROUND OF THE INVENTION

1. Field of the Invention

The present invention relates to a network system having a network device using an associative memory and, in particular, to an associative memory having a mask function.

2. Description of the Prior Art

The function that compares the length of the significant part between network addresses to thereby calculate an optimal destination taking it into account is indispensable to a conventional network device (for example a router) in a computer network system, and an associative memory is used in order to achieve this function.

Referring to FIG. 11, a conventional computer network will be described. A user or subscriber of the network has a user's terminal, such as a computer terminal, for connection to the network. A user's terminal is assigned with a specific network address in accordance with a predetermined rule when it is connected to the network in order to be distinguished from other user's terminals. Herein, the network address is represented by a numeral of a plurality of digits of, for example, first through third digits (a.b.c). The predetermined rule defines a hierarchical structure of the network address, for example, the first digit of the numeral represents a nation, such as England, Germany, and Japan, and the second digit of the numeral represents a company name in the nation. In the following description, these hierarchical items will be called segments. Referring to FIG. 11, each segment is depicted by a hierarchical structure. In the view, one rectangle surrounded by a thick line represents one segment. Specifically, the network includes a first segment (SEGMENT1), second segment (SEGMENT2), and a third segment (SEGMENT3) at a highest hierarchical level in FIG. 11. The first segment (SEGMENT1), the second segment (SEGMENT2), and the third segment (SEGMENT3) include a fourth segment (SEGMENT4) and a fifth segment (SEGMENT5), a sixth segment (SEGMENT6), and a seventh segment (SEGMENT7), respectively. A user's terminal 401-1 exists in the fourth segment. The first segment has a network address (1.*.*) in which a first digit alone is specified as "1". The fourth segment subordinate to the first segment has a network address (1.2.*) in which first and second digits "1" and "2" are specified. The fifth segment subordinate to the first segment has a network address (1.3.*) in which first through second digits "1" and "3" are specified. Thus, the user's terminal 401-1 in the fourth segment has a specific or unique network address (1.2.6). The second segment has a network address (2.*.*) in which a first digit alone is specified as "2". The sixth segment subordinate to the second segment has a network address (2.6.*) in which first and second digits "2" and "6" are specified. User's terminals 401-2 and 401-3 exist in the sixth segment. The sixth segment subordinate to the second segment has a network address (2.6.*) in which first and second digits "2" and "6" are specified. Thus, the user's terminals 401-2 and 401-3 in the sixth segment have specific or unique network addresses (2.6.4) and (2.6.5), respectively. Further, the third segment has a network address (3.*.*) in which a first digit alone is specified as "3". The seventh segment subordinate to the third segment has a network address (3.2.*) in which first and second digits "3" and "2" are specified. A symbol "*" contained in these addresses represents "don't care".

Each digit of each network address is represented by a binary number of three bits. Thus, each network address is represented by a bit sequence of nine bits in total. For example, a network address (1.2.*) is represented by a binary bit sequence (001.010.000). Hereinafter, a bit sequence represented as above-mentioned representation is called a storage data. Since the symbol "*" represents "don't care" for a third digit, it is necessary to indicate that the first through the sixth bits (001.010) in the bit sequence (001.010.000) alone are valid and the remaining bits (000) are invalid. For this purpose, mask information (or mask data) is combined with the storage data. Hereinafter, this pair is called structured data. In said example, the corresponding mask information is given by a bit sequence "111.111.000" in binary numbers notation. Herein, "1" and "0" represent a mask invalid state and a mask valid state, respectively.

In order to connect or establish communication between a plurality of user's terminals in the network, each segment is provided with a network device. As illustrated in FIG. 11, the first segment is provided with the first network device 400-1, the second segment is provided with the second network device 400-2, the third segment is provided with the third network device 400-3, the forth segment is provided with the forth network device 400-4, the fifth segment is provided with the fifth network device 400-5, the sixth segment is provided with the sixth network device 400-6, and the seventh segment is provided with the seventh network device 400-7. As illustrated in FIG. 11, each network device is connected to any network devices or any user's terminals subordinate to the corresponding segment. In addition, the network device 400-1 is also connected to the network device 400-2, the network device 400-3, and the network device 400-6.

Each network device in the corresponding segment is supplied from any user's terminals or any network devices connected to the network device with transfer data and a destination network address annexed thereto. With reference to the destination network address and the relationship of connection of network devices, the network device calculates an optimum transfer route and transfers the transfer data via the optimum transfer route thus calculated.

Herein, when the network device 400-1 transfers communication data where the destination network address corresponding to the user's terminal 401-2 is (2.6.4) in FIG. 11, as is understood from the drawing, it is most suitable to transfer the communication data to the network device 400-6 corresponding to the network address (2.6.*) which shows the segment 6 rather than transferring the communication to the network device 400-2 corresponding to the network address (2.*.*) which shows the segment 2. It will therefore be understood that it is most suitable to select a network device corresponding to a network address with mask information having the least number of bits in a valid state for the mask information among network addresses coincident with the destination network address taking the mask information into account.

Thus, the user's terminals are not directly connected by the use of the communication channels but carry out communication by controlling the transfer of the transfer data by the use of the network devices. Thus, communication channels as limited resources are saved.

Next, referring to FIG. 12, description will be directed to calculating the transfer network address of these conventional network devices. In the drawing, although the network device 400-1 is illustrated by way of example, other network devices have a similar structure. A destination network address annexed to the transfer data supplied to the network device 400-1 is supplied to a conventional associative memory 100 as search data 101. The conventional associative memory 100 stores network addresses which show segments, to which network devices 400-2, 400-3, 400-4, 400-5 and 400-6 connected to the network device 400-1 belong, in the form of the above-mentioned structured data. Therefore, in the example in FIG. 12, a primary associative memory word 109-1 stores the network address (2.*.*) for the segment 2 to which the network device 400-2 belongs in the form of structured data represented by a pair of the storage data "010.000.000" and the mask information "111.000.000" as mentioned above. Similarly, a primary associative memory word 109-2, a primary associative memory word 109-3, a primary associative memory word 109-4, and a primary associative memory word 109-5 store the network address (3.*.*) for the segment 3 to which the network device 400-3 belongs, the network address (1.2.*) for the segment 4 to which the network device 400-4 belongs, the network address (1.3.*) for the segment 5 to which the network device 400-5 belongs and the network address (2.6.*) for the segment 6 to which the network device 400-6 belongs in the form of above-mentioned structured data, respectively.

The associative memory 100 has searching (or retrieving) function or mask searching function in addition to write/read functions of writing and reading storage data (namely, the address data) at a designated memory address in the matter similar to an ordinary memory circuit. Specifically, the associative memory 100 has the mask searching function to put the only match line 102 corresponding to the storage data with the least number of bits into a mask valid state, in the match lines 102 corresponding to one of the storage data coincident with the search data 101 taking the mask information into account, into a valid state. Formerly, an associative memory which has been disclosed in, for example Japanese Patent Application No. 3191737 or the like is known as this kind of associative memory 100.

An encoder 402 encodes the mask match lines 1024 through 102-5 that the associative memory 100 supplies into a memory address signal 403. The memory 404 stores network addresses of the network devices corresponding to the segment network addresses each of which is stored in each of primary associative memory words 109-1 through 109-5 of the associative memory 100. In the memory 404, each network address of the network device is stored in a word corresponding to the associative memory words 109-1 through 109-5 of the associative memory 100 where a corresponding network address is stored. For example, the network address (2.*.*) is stored in the primary associative memory word 109-1 of the associative memory 100 while the network address of the network device 400-2 (FIG. 11) corresponding thereto is stored in the first word of the memory 404. Similarly, the network address of the network device 400-3, the network address of the network device 400-4, the network address of the network device 400-5, and the network address of the network device 400-6 are stored in the second word, the third word, the fourth word, and fifth word of the memory 404, respectively. Supplied with the memory address signal 403 as a read address, the memory 404 produces a memory data signal 405 stored in the word designated by the memory address signal 403. The memory data signal 405 is used as a new transfer network address of the transfer data.

Although not illustrated in the figure, each of network devices 400-1 through 400-7 has a CPU for controlling the above-mentioned operation of the network device.

Next, description will be made about an operation of the transfer network address calculation by the conventional network device in the network system. It is assumed here that the destination network address supplied to the network device 400-1 has a destination network address (2.6.5) corresponding to the user's terminal 401-3. As a result of search by the associative memory 100, (2.*.*) in the primary associative memory word 109-1 and (2.6.*) in the primary associative memory word 109-5 are coincident. Among those coincident network addresses, the network address (2.6.*) in the primary associative memory word 109-5 has the least number of bits in a mask valid state so that only the match line 102-5 corresponding to the primary associative memory word 109-5 is put into a valid state. Therefore, the encoder 402 produces "5" as the memory address signal 403. In response to the memory address signal 403, the memory 404 produces as the memory data signal 405 the network address (2.6.*) for the network device 400-6 stored in the fifth word. Consequently, the network device 400-1 transfers the input communication data including the destination network address (2.6.5) to the network device 400-6. The network device 400-6 is responsive to the transfer data and performs the operation similar to that mentioned above. Thus, the transfer data are successively transferred from a network device to a network device until the user's terminal 401-3 at the destination network address (2.6.5) is reached.

(Description of the Conventional Associative Memory)

Herein, referring to FIG. 13, a typical conventional associative memory will be described. The associative memory 100 of a first through m-th words n-bit configuration (m and n are integer variables) comprises an associative memory 103 for primary searching operation of a first through m-th words n-bit configuration, and an associative memory 104 for secondary searching operation of a first through m-th words n-bit configuration, and has primary bit lines 105-1 through 105-$n$ supplied with the n-bit search data 101, and match lines 102-1 through 102-$m$, m in number for delivering the final result of the searching operation.

The associative memory 103 for primary searching operation of a first through m-th words n-bit configuration is supplied with the primary bit lines 105-1 through 105-$n$, and produces primary match lines 116-1 through 116-$m$ and intermediate data lines 106-1 through 106-$n$. The associative memory 103 for primary searching operation comprises primary associative memory words 109-1 through 109-$m$ which can store the structured data comprising the storage data and the mask information (or mask data), each being n-bit. The primary associative memory words 109$j$ (j is an integer variable between 1 and m, both inclusive) comprise data cells 110-$j$-1 through 110-$j$-$n$ for storing the n-bit storage data and mask cells 111-$j$-1 through 111-$j$-$n$ for storing the corresponding n-bit mask information. Herein, when a digit of the structured data is represented by the symbol "*" as "don't care", the corresponding bit of the storage data is stored in the corresponding data cell 110 with an invalid state for the storage data, and the corresponding bit of the mask information is stored in the corresponding mask cell 111 with a valid state for the mask information. The associative memory 103 for primary searching operation carries out a primary searching operation to search storage data coincident with the primary bit lines 105-1 through 105-$n$ taking the corresponding mask information into account, and puts a primary match line 116 corresponding to the primary associative memory word 109 which stores the coincident storage data into a valid state, and puts other primary match lines 116 into an invalid state. The associative memory 103 for primary searching operation also supplies a value obtained from a result of a logical sum operation (an OR operation), with a valid state for the storage data as true, of all the coincident storage data to the intermediate data lines 106-1 through 106-$n$. A state of the intermediate data lines 106-1 through 106-$n$ is supplied to secondary bit lines 108-1 through 108-$n$ as n-bit intermediate data 107.

The associative memory 104 for secondary searching operation of a first through m-th words n-bit configuration is supplied with the secondary bit lines 108-1 through 108-$n$, and produces secondary match lines 126-1 through 126-$m$. The associative memory 104 for secondary searching operation comprises secondary associative memory words 112-1 through 112-$m$ which can store n-bit secondary storage data. A j-th secondary associative memory word 112$j$ has data cells 113-$j$-1 through 113-$j$-$n$ for storing the n-bit secondary storage data. The associative memory 104 for secondary searching operation carries out a secondary searching operation to search secondary storage data coincident with the secondary bit line 108-1 through 108-$n$, and puts a secondary match line 126 corresponding to the secondary associative memory word 112 which stores the coincident secondary storage data into a valid state, and puts other secondary match lines 126 into an invalid state. A state of the secondary match lines 126-1 through 126-$m$ is supplied to an external source as the match lines 102-1 through 102-$m$. In this conventional example, the same value as the n-th bit storage data stored in the data cells 110-$j$-1 through 110-$j$-$n$ of the corresponding primary associative memory word 109$j$ is stored in the data cells 113-$j$-1 through 113-$j$-$n$ as the n-bit secondary storage data.

Referring to FIG. 14, the associative memory 103 for primary searching operation of a first through m-th words n-bit configuration in the first through m-th words n-bit conventional associative memory 100 will be described. The associative memory 103 for primary searching operation of a first through m-th words n-bit configuration comprises the n-bit primary associative memory words 109-1 through 109-$m$, resisters 121-1 through 121-$n$, and inverted logical gates 122-1 through 122-$n$. The j-th (where j is an integer variable between 1 and m, both inclusive) primary associative memory word 109$j$ comprises first through n-th associative memory cells 118-$j$-1 through 118-$j$-$n$. The j-th primary associative memory word 109$j$ is connected to a corresponding data word line 115$j$ and a corresponding mask word line 117$j$ as input lines, and to a corresponding primary match line 116$j$ and matched data intermediate logical lines 114-1 through 114-$n$ as output lines, and to the first through the n-th primary bit lines 105-1 through 105-$n$ as data input/output lines.

A associative memory cell 118-$j$-$k$ of a k-th digit (k is an integer variable between 1 and n, both inclusive) of the j-th primary associative memory word 109$j$ is connected to the corresponding data word line 115$j$ and the corresponding mask word line 117$j$ as input lines, and to the corresponding primary match line 116$j$ and a corresponding matched data intermediate logic line 114-$k$ as output lines, and to a primary bit line 105-$k$ as data input/output lines.

The associative memory cell 118-$j$-$k$ comprises a data cell 110-$j$-$k$, a comparator 119-$j$-$k$, a mask cell 111-$j$-$k$, and a logical gate 120-$j$-$k$. The data cell 110-$j$-$k$ is for storing "data" bit information at a corresponding bit of storage data supplied from an external source through the primary bit line 105-$k$. The comparator 119-$j$-$k$ is for comparing the "data" bit information memorized in the data cell 110-$j$-$k$ and the "search" bit information supplied through the primary bit line 105-$k$ from the external source. The mask cell 111-$j$-$k$ is for storing "mask" bit information of a corresponding bit of mask information supplied from the external source through the primary bit line 105-$k$. Herein, when the bit information stored in the mask cell 111-$j$-$k$ is in a valid state for mask information, an invalid state for storage data is stored in corresponding data cell 110-$j$-$k$.

In this embodiment, a valid state and an invalid state for the mask information are represented by "0" and "1", respectively and a valid state and an invalid state for the storage data are represented by "1" and "0", respectively. Similar to the storage data, a valid state and an invalid state are represented by "1" and "0", respectively, for the intermediate data lines 106-1 through 106-$n$. A valid state and an invalid state are represented by "1" and "0", respectively, for the primary match lines 116-1 through 116-$m$, the secondary match lines 126-1 through 126-$m$, and the match lines 1021 through 102-$m$.

The data cell 110-$j$-$k$ stores as the storage data the state on the corresponding primary bit line 105-$k$ on which the write data is driven when a corresponding data word line 115$j$ is in a valid state, or supplies the storage data stored therein to the corresponding primary bit line 105-$k$ on which the write data is not driven when a corresponding data word line 115$j$ is in a valid state. When the corresponding data word line 115$j$ is in an invalid state, no operation is performed for the corresponding primary bit line 105-$k$. Irrespective of the state of the corresponding data word line 115-$j$, the storage data stored therein is supplied to the comparator 119-$j$-$k$ and the logical gate 120-$j$-$k$ in the same associative memory cell 118-$j$-$k$.

The mask cell 111-$j$-$k$ stores as the mask information the state on a corresponding primary bit line 105-$k$ on which the write data is driven when a corresponding mask word line 117$j$ is in a valid state, or supplies the mask information stored therein to the corresponding primary bit line 105-$k$ on which the write data is not driven when a corresponding mask word line 117$j$ is in a valid state. When the corresponding mask word line 117$j$ is in an invalid state; no operation is performed for the corresponding primary bit line 105-$k$. Irrespective of the state of the corresponding mask word line 117-$j$, the mask information stored therein is supplied to the comparator 119-$j$-$k$ in the same associative memory cell 118-$j$-$k$.

Prior to the primary searching operation, the primary match lines 116-1 through 116-$m$ are precharged to a high level to be put into a valid state "1".

The comparator 119-$j$-$k$ is supplied with the value of the search data on the corresponding primary bit line 105-$k$, the storage data stored in the data cell 110-$j$-$k$, and the mask information stored in mask cell 111-$j$-$k$, in the same associative memory cell 118-$j$-$k$. When the mask information is in a valid state "0" or when the value on the corresponding primary bit line 105-$k$ and the storage data in the data cell 110$j$ are coincident with each other, the corresponding primary match line 116$j$ is put into an opened state. Otherwise, the comparator 119-$j$-$k$ puts the primary match line 116$j$ into an invalid state "0". Thus, the wired AND logic connection with a valid state "1" for the primary match line 116 as true is achieved such that, when all the comparators 119-$j$-1 through 119-$j$-$n$, n in number, in the j-th primary associative memory word 109-3 render the primary match line 116$j$ in an opened state, the primary match line 116$j$ is put into a valid state "1", and otherwise into an invalid state "0". In other words, upon the primary searching operation, only when all of the storage data stored in a primary associative memory word 109$j$ is completely coincident with the value of the primary bit lines 105-1 through 105-$n$ except those bits excluded from a comparison object by the mask valid state "0" in the corresponding mask information, the primary match line 116*j* is put into a valid state "1", and otherwise, into an invalid state "0".

The logical gate 120-*j*-*k* supplies an invalid state "0" of the intermediate data line 106 to the corresponding matched data intermediate logic line 114-*k* when the primary match line 116*j* in the same primary associative memory word 109*j* is in a valid state "1" and the storage data stored in the corresponding data cell 110-*j*-*k* in the same associative memory cell 118-*j*-*k* is in a valid state "1" for the storage data. Otherwise, the logical gate 120-*j*-*k* puts the matched data intermediate logic line 114-*k* into an opened state. The matched data intermediate logic line 114-*k* (where k is an integer variable between 1 and n, both inclusive) is put into a valid state "1" for the intermediate data line 106 through a resister 121-*k*. The matched data intermediate logic line 114-*k* is connected to all of the corresponding logical gates 120-1-*k* through 120-*m*-*k*, m in number, by a wired logic connection. Thus, when all of the connected logical gate 120-1-*k* through 120-*m*-*k*, m in number, render the matched data intermediate logic line 114-*k* in an opened state, the matched data intermediate logic line 114-*k* is put into a valid state "1" for the intermediate data line 106, and otherwise into an invalid state "0" for the intermediate data line 106.

Each of the inverted logical gates 122-1 through 122-*n* supplies an inverted value of the corresponding matched data intermediate logic lines 114-1 through 114-*n* to the corresponding intermediate data lines 106-1 through 106-*n*.

Therefore, the intermediate data line 106-*k* is supplied with a result of a logical sum operation, with a valid state for the storage data as true, of all the storage data stored in the corresponding data cells 110-1-*k* through 110-*m*-*k* in all of the k-th bit associative memory cells 118-1-*k* through 118-*m*-*k* which have the primary match lines 116-1 through 116-*m* that are in a valid state "1" upon completion of the primary searching operation by the inverted logical gate 122-*k*, the resister 121-*k*, the matched data intermediate logic line 114-*k*, and corresponding logical gates 120-1-*k* through 120-*m*-*k*, m in number. In this embodiment, the intermediate data line 106-*k* is supplied with a result of a logical sum operation with the valid state "1" for the storage data as true. As mentioned above, upon completion of the primary searching operation, the intermediate data lines 106-1 through 106-*n* are supplied with the same value of the storage data coincident with the search data 101 that has the least number of bits in an invalid state "0".

Referring to FIG. 15, the associative memory 104 for secondary searching operation of a first through m-th words n-bit configuration in the conventional associative memory 100 of a first through m-th words n-bit will be described. The associative memory 104 for secondary searching operation of a first through m-th words n-bit configuration comprises secondary associative memory words 112-1 through 112-*m*. A j-th secondary associative memory word 112*j* (where j is an integer variable between 1 and m, both inclusive) comprises associative memory cells 123-*j*-1 through 123-*j*-*n*, n in number. The secondary associative memory word 112*j* is connected to the corresponding data word line 125-*j* as input lines, to the corresponding secondary match line 126*j* as output lines, and to the secondary bit lines 108-1 through 108-*n*, n in number as data input/output lines.

An associative memory cell 123-*j*-*k* (where k is an integer variable between 1 and n, both inclusive) of the k-th bit of the j-th secondary associative memory word 112*j* is connected to the corresponding data word line 125-*j* as input lines, to the corresponding secondary match line 126*j* as the output lines, and to the secondary bit line 108-*k* as data input/output line.

The associative memory cell 123-*j*-*k* comprises a data cell 113-*j*-*k* and a comparator 124-*j*-*k*. The data cell 113-*j*-*k* is for storing "data" bit information at a corresponding bit of the secondary storage data supplied from the external source through the secondary bit line 108-*k*. The comparator 124-*j*-*k* is for comparing the "data" bit information stored in the data cell 113-*j*-*k* and "search" bit information supplied from the external source through the secondary bit line 108-*k*.

The data cell 113-*j*-*k* stores as the secondary storage data the state on a corresponding secondary bit line 108-*k* on which the write data is driven when a corresponding data word line 125-*j* is in a valid state, or supplies the storage data stored therein to the corresponding secondary bit line 108-*k* on which the write data is not driven when a corresponding data word line 125-*j* is in a valid state. When the corresponding data word line 125-*j* is in an invalid state, no operation is performed for the corresponding secondary bit line 108-*k*. Irrespective of the state of the corresponding data word line 125-*j*, the secondary storage data stored therein is supplied to the comparator 124-*j*-*k* in the same associative memory cell 123-*j*-*k*.

Prior to the secondary searching operation, the secondary match lines 126-1 through 126-*j* are precharged to a high level to be put into a valid state "1".

The comparator 124-*j*-*k* is supplied with the value of the search data on the corresponding secondary bit line 108-*k* and the secondary storage data stored in the data cell 113-*j*-*k* in the same associative memory cell 123-*j*-*k*. When the value of the secondary bit line 108-*k* and the secondary storage data stored in the data cell 113-*j*-*k* are coincident with each other, the comparator 124-*j*-*k* puts the secondary match line 126-*j* into an opened state, and otherwise, into an invalid state "0". Thus, the wired AND logic connection with the valid state "1" for the secondary match line 126 as true is achieved such that, when all the comparators 124-*j*-1 through 124-3-*n*, n in number, in the j-th secondary associative memory word 112-*j* render the secondary match line 126-*j* in an opened state, the secondary match line 126-*j* is put into a valid state "1", and otherwise, into an invalid state "0". In other words, upon the secondary searching operation, only when all of the secondary storage data stored in the secondary associative memory word 112-*j* are completely coincident with the values of the secondary bit lines 108-1 through 108-*k*, the secondary match line 126-*j* is put into a valid state "1", and otherwise into an invalid state "0".

(Operation of the Conventional Associative Memory)

Next, referring to FIG. 16, description will be made about the operation when the above-mentioned conventional associative memory 100 is used in calculating the transfer network address in the network device 400-1 in FIG. 11. It is therefore assumed that the associative memory 100 comprises a first through fifth words nine-bit configuration in FIG. 16.

The associative memory 100 memorizes the connection information of the network device 400-1 in FIG. 11 in each of the primary associative memory words 109-1 through 109-5 as the storage data and the mask information. Herein, when a digit of a network address is represented by the symbol "*" as "don't care", the corresponding bit of the storage data is stored with an invalid state "0" for the storage data, and the corresponding bit of the mask information is stored with a valid state "0" for the mask information.

Specifically, the primary associative memory word 109-1 stores in binary numbers notation the storage data "010.000.000" and the mask information "111.000.000" to represent the network address (2.*.*) for the segment 2 in the form of structured data. Similarly, the primary associative memory word 109-2 stores in binary numbers notation the storage data "011.000.000" and the mask information "111.000.000" to represent the network address (3.*.*) for the segment 3 in the form of structured data. The primary associative memory word 109-3 stores in binary numbers notation the storage data "001.010.000" and the mask information "111.111.000" to represent the network address (1.2.*) for the segment 4 in the form of structured data. The primary associative memory word 109-4 stores in binary numbers notation the storage data "001.011.000" and the mask information "111.111.000" to represent the network address (1.3.*) for the segment 5 in the form of structured data. The primary associative memory word 109-5 stores in binary numbers notation the storage data "010.110.000" and the mask information "111.111.000" to represent the network address (2.6.*) for the segment 6 in the form of structured data.

Further, the secondary associative memory words 112-1 through 112-5 of the associative memory 104 for secondary searching operation store the same value as the storage data of the corresponding primary associative memory words 109-1 through 109-5 as the secondary storage data. Therefore, the secondary associative memory word 112-1 stores in binary numbers notation "010.000.000"; the secondary associative memory word 112-2, in binary numbers notation "011.000.000"; the secondary associative memory word 112-3, in binary numbers notation "001.010.000"; the secondary associative memory word 112-4, in binary numbers notation "001.011.000"; and the secondary associative memory word 112-5, in binary numbers notation "010.110.000", respectively.

Prior to the primary searching operation, all of the primary match lines 116-1 through 116-5 are precharged to a high level to be put into a valid state "1". Further, prior to the secondary searching operation, all of the secondary match lines 126-1 through 126-5 are precharged to a high level to be put into a valid state "1".

Description will proceed to the searching operation by supplying as the search data 101 the network address (2.6.5) in octal numbers notation, of the user's terminal 401-3 in FIG. 11.

The value "010.110.101" in binary numbers notation of nine bits of the search data 101 is supplied to the nine primary bit lines 105-1 through 105-9, and the associative memory 103 for primary searching operation carries out the primary searching operation. As a result, (2.*.*) in octal numbers notation stored in the primary associative memory word 109-1 and (2.6.*) in octal numbers notation stored in the primary associative memory word 109-5 are coincident with the search data on the primary bit lines 105-1 through 105-9. Accordingly, as a result of the primary searching operation, two primary match lines 116-1 and 116-5 are put into a valid state "1", and the remaining primary match lines 116-2, 116-3, and 116-4 are put into an invalid state "0".

Herein, the intermediate data line 106-1 produces the logical sum "0", with "1" as true, of the storage data "0", and "0" in the primary associative memory words 109-1 and 109-5 at bit positions corresponding to the intermediate data line 106-1. The intermediate data line 106-2 produces the logical sum "1", with "1" as true, of the storage data "1", and "1" in the primary associative memory words 109-1 and 109-5 at bit positions corresponding to the intermediate data line 106-2. Likewise, the intermediate data line 106-3, 106-4, 106-5, 106-6, 106-7, 106-8, and 106-9 produce the logical sum "0" of "0" and "0", logical sum "1" of "0" and "1", logical sum "1" of "0" and "1", logical sum "0" of "0" and "0", logical sum "0" of "0" and "0", logical sum "0" of "0" and "0", and logical sum "0" of "0" and "0", respectively, with "1" as true. As a result, the intermediate data 107 is supplied with "010110000" in binary numbers notation.

The value of the intermediate data 107 is supplied to the secondary bit lines 108-1 through 108-9, and the associative memory 104 for secondary searching operation carries out a secondary searching operation. As a result, only the binary notation "010110000" stored in the secondary associative memory word 112-5 is completely coincident with the state on the secondary bit lines 108-1 through 108-9. Only the secondary match line 126-5 is therefore put into a valid state "1", and the remaining secondary match lines 126-1, 126-2, 126-3, and 126-4 are put into an invalid state "0". Thus, the associative memory 100 puts only the match line 102-5 into a valid state "1".

It will therefore be understood that, in the match line 102 corresponding to one of the storage data coincident with the search data 101 taking the mask information into account, the conventional associative memory 100 can put only the match line 102-5 corresponding to the storage data with the least number of bits into a mask valid state for the mask information into a valid state. It will further be understood that, even when one clock time is required for the primary searching operation and the secondary searching operation, respectively, by a clock signal (not shown), since the conventional associative memory 100 comprises the associative memory 103 for primary searching operation for carrying out the primary searching operation, and the associative memory 104 for secondary searching operation for carrying out the associative memory for secondary searching operation, independently, it is possible to carry out the calculation of the transfer network address by supplying the search data 101 for every clock.

In the conventional associative memory 100 of a first through m-th words n-bit configuration mentioned above, since the n-bit intermediate data 107 produced by the associative memory 103 for primary searching operation of a first through m-th words n-bit configuration is supplied to the associative memory 104 for secondary searching operation, the associative memory 104 for secondary searching operation is required to be a first through m-th words n-bit configuration.

Herein, the data cells 110-1-1 through 110-m-n and the mask cells 111-1-1 through 111-m-n in the associative memory 103 for primary searching operation, and the data cells 113-1-1 through 113-m-n of the associative memory 104 for secondary searching operation can be comprised of typical SRAMs (Static Random Access Memory) comprising six MOS transistors. In this case, the area of each MOS transistor that composes the SRAM is similar to the circuit area of the minimum MOS transistor for manufacturing the conventional associative memory 100, in general.

However, as illustrated in FIG. 14, the primary match line 116-j is connected to the comparators 119-j-1 through 119-j-n in the first through n-th associative memory cells 118-j-1 through 118-j-n by a wired AND logic connection so that the primary match line 116-j requires enough length to achieve this connection. Thus, the parasitic capacitance of the primary match lines 116-1 through 116-m is very large, so that MOS transistors that compose the comparator 119 require large circuit area in order to drive the large parasitic capacitances of each of the primary match lines 116. For example, in a case of 0.25 micron meter rule manufacturing process, the wiring length is required about 1 millimeter in order to connect to 64 associative memories 118, so that the parasitic capacitance of each primary match lines 116 is about 0.3 pF. Accordingly, the size of each transistor that drives above-mentioned capacitance requires about 10 to 30 times as large as the size of the minimum MOS transistor for the manufacturing process. Likewise, as illustrated in FIG. 15, the secondary match line 126-$j$ is connected to the first through n-th associative memory cells 123-$j$-1 through 123-$j$-$n$ by a wired AND logic connection so that the size of each MOS transistor that composes the comparator 124 requires about 10 to 30 times as large as the size of the minimum MOS transistor for the manufacturing process. Further, as illustrated in FIG. 14, the matched data intermediate logic line 114-$k$ is also connected to the logical gates 120-1-$k$ through 120-$m$-$k$ in the first to the m-th primary associative memory words 109-1 through 109-$m$ by a wired AND connection so that the size of each MOS transistor that composes the logical gates 120 requires about 10 to 30 times as large as the size of the minimum MOS transistor for the manufacturing process.

Herein, if it is assumed that the circuit area of each MOS transistor that composes the comparator 119, the comparator 124, and the logical gate 120 requires 10 times as large as the circuit area of the minimum MOS transistor, and if it is further assumed that the comparator 119 comprises four MOS transistors, the comparator 120 comprises three MOS transistors, and the logical gate 120 comprises two MOS transistors, then the circuit area of the associative memory cell 118 that composes the associative memory 103 for primary searching operation is 72 times as the circuit area of the minimum MOS transistor, and the circuit area of the associative memory cell 123 that composes the associative memory 104 for secondary searching operation is 36 times as the circuit area of the minimum MOS transistor.

Therefore, in the conventional associative memory 100 of a first through m-th words n-bit configuration, both the associative memory 103 for primary searching operation and the associative memory 104 for secondary searching operation comprise a first through m-th words n-bit configuration associative memory, so that, irrespective of the bit width of the search data 101, the total circuit area excluding the associative memory 103 for primary searching operation requires 0.5 times as the circuit area of the associative memory 103 for primary searching operation.

In the meanwhile, only the n primary match lines, n in number having the same bit length as that of the mask information among the primary match lines 116-1 through 116-$m$, in in number maintain a valid state upon completion of the primary searching operation at the maximum, and the remaining primary match lines, (m−n) in number discharge the charge that has been precharged to a valid state before searching operation. Only one secondary match line among the secondary match lines 126-1 through 126-$m$, m in number, maintains a valid state upon completion of the secondary searching operation, and the remaining secondary match lines, (m−1) in number discharge the charge that has been precharged to a valid state before searching operation Therefore, if the associative memory comprises the first through 32768th 64-bit associative memory words, the parasitic capacitance corresponding to 65,471 lines at the minimum in sum of the primary match lines 116 and the secondary match lines 126 requires being precharged as given by (32,768−64)+(32,768−1)=65,471 for every searching operation. The numbers of the matched data intermediate logic lines 114-1 through 114-$n$, the primary bit lines 105-1 through 105-$n$, and the secondary bit lines 108-1 through 108-$n$ are n in number, respectively, and since the number is 192 in total in the above-mentioned example, the parasitic capacitance can be negligible. In other words, power consumption of the conventional associative memory 100 mainly comprises the power that is consumed when the primary match line 116 and the secondary match line 126 are precharged for every searching operation. Herein, if the associative memory is produced using 0.25 micron meter rule manufacturing process and comprises the first through 32768th 64-bit associative memory words, the parasitic capacitance per one line of the primary match line 116 and the secondary match line 126 is about 0.3 pF as mentioned above, respectively. Accordingly, if it is assumed that the supplied voltage is 2.5 V and the searching period is 20 ns, then the power consumption of the whole chip is very large as given by (0.3 pF×2.5 V)/20 ns×2.5 V×65,471=6.14 W.

Therefore, the network device where the conventional associative memory 100 is used in calculating the transfer network address has also very large power consumption.

The Japanese Patent Application No. 3191737 also describes the configuration where while the associative memory for primary searching operation is provided with n-bit selection means and n-bit memory means, the associative memories for primary and secondary searching operations share their components with each other without increasing the number of the transistors of the associative memory for primary searching operation by controlling the operation of the comparator in each associative memory cell. In this case, although the problems of a large chip size and high power consumption are solved, the search data 101 cannot be supplied for every clock in order that the primary searching operation and the secondary searching operation share the same component with each other, and the execution speed of calculating the transfer network address is further decreased than that of the above-mentioned associative memory 100 by ½ or more.

It is therefore an object of the present invention to provide an associative memory which can perform the operation for every clock to produce the signal identifying, among the storage data coincident with the search data, particular storage data corresponding to the mask information with the least number of bits in a valid state, and has large storage capacity per unit of chip area.

It is another object of the present invention to provide an associative memory which can perform the operation for every clock to produce the signal identifying, among the storage data coincident with the search data, particular storage data corresponding to the mask information with the least number of bits in a valid state, and has small power consumption.

It is still another object of the present invention to reduce the power consumption of the network device, and provide a network system capable of transferring data at a high speed.

SUMMARY OF THE INVENTION

According to a first aspect of the invention, there is provided an associative memory comprising:

a first memory incorporating m-pieces of words therein, each word storing a first storage data with n-bit length and a mask information data corresponding to each one or more first storage data, wherein m and n are natural numbers, the mask information data determining whether or not each bit string of the first storage data should be excluded as a retrieval data by setting mask state to be valid or invalid; the first memory comparing an input primary retrieval data with n-bit length with the first storage data for word by word, outputting a primary match signal when the both data are matched, and outputting logical operation results among the matched first storage data as an intermediate data;

a compressive operation means for compressing a bit length of the intermediate data to be p-bit length, wherein p is a natural number, to output as a secondary retrieval data;

a second memory for storing m-pieces of second storage data with p-bit length in a manner to correspond to each word of the first storage data, the second storage data being derived by compressing the first storage data for word by word; the second memory comparing the secondary retrieval data with the second storage data for word by word and outputting a secondary match signal when the both data are matched; and an invalidation means for altering the secondary match signal corresponding to the primary match signal to be in a mismatch state when a mismatch occurs between each primary match signal output from each word of the first memory.

According to a second aspect of the invention, there is provided an associative memory comprising:

a first memory incorporating m-pieces of words therein, each word storing m-pieces of structuring data comprising a first storage data with n-bit length, wherein m and n are natural numbers, and a mask information data determining whether or not each bit string of the first storage data should be excluded as a retrieval data by setting mask state to be valid or invalid; the first memory comparing an input primary retrieval data with n-bit length with the first storage data in the structuring data for word by word, outputting a primary match signal when the both data are matched, and outputting logical operation results among the matched mask information data as an intermediate data;

a compressive operation means for compressing a bit length of the intermediate data to be p-bit length, wherein p is a natural number, to output as a secondary retrieval data;

a second memory for storing m-pieces of second storage data with p-bit length in a manner to correspond to each word of the first storage data, the second storage data being derived by compressing the mask information data for word by word; the second memory comparing the secondary retrieval data with the second storage data for word by word and outputting a secondary match signal when the both data are matched; and an invalidation means for altering the secondary match signal corresponding to the primary match signal to be in a mismatch state when a mismatch occurs between each primary match signal output from each word of the first memory.

According to a third aspect of the invention, there is provided an associative memory comprising:

a first memory incorporating m-pieces of words therein, each word storing m-pieces of structuring data comprising a first storage data with n-bit length, wherein m and n are natural numbers, and a mask information data determining whether or not each bit string of the first storage data should be excluded as a retrieval data by setting mask state to be valid or invalid; the first memory comparing an input primary retrieval data with n-bit length with the first storage data in the structuring data for word by word, outputting a primary match signal when the both data are matched, and outputting logical operation results among the mask information data and the primary retrieval data in a matching word as an intermediate data;

a compressive operation means for compressing a bit length of the intermediate data to be p-bit length, wherein p is a natural number, to output as a secondary retrieval data;

a second memory for storing m-pieces of second storage data with p-bit length in a manner to correspond to each word of the first storage data, the second storage data being derived by compressing the first storage data for word by word; the second memory comparing the secondary retrieval data with the second storage data for word by word and outputting a secondary match signal when the both data are matched; and an invalidation means for altering the secondary match signal corresponding to the primary match signal to be in a mismatch state when a mismatch occurs between each primary match signal output from each word of the first memory.

According to a fourth aspect of the invention, there is provided an associative memory as set forth in any one of claim 1, 2 or 3, wherein the compressive operation means counts the number of bits in an invalid state in the intermediate data and performs the compressive operation in accordance with the counting value.

According to a fifth aspect of the invention, there is provided an associative memory as set forth in claim 4, wherein the counting value is the number of successive bits in an invalid state which are from a first bit position to a second bit position of the intermediate data.

According to a sixth aspect of the invention, there is provided an associative memory as set forth in any one of claim 1, 2 or 3, wherein the compressive operation means counts the number of bits in a valid state in the intermediate data and performs the compressive operation in accordance with the counting value.

According to a seventh aspect of the invention, there is provided an associative memory as set forth in claim 6, wherein the counting value is the number of successive bits in a valid state which are from a first bit position to a second bit position of the intermediate data.

According to an eighth aspect of the invention, there is provided an associative memory as set forth in any one of claim 1, 2 or 3, wherein the first memory does not store the mask information data and the corresponding first storage data when the mask information data reveals a mask valid state in all bits.

According to a ninth aspect of the invention, there is provided an associative memory as set forth in any one of claim 1, 2 or 3, wherein the associative memory comprises a means for synchronizing the output timing of the primary match signal and the secondary match signal.

According to a tenth aspect of the invention, there is provided an associative memory as set forth in any one of claim 1, 2 or 3, wherein the invalidation means includes a precharge control means which charges or discharges to be in a mismatch state when the primary match signal is in a mismatch state and charges or discharges to be in a match state when the primary match signal is in a match state.

According to an eleventh aspect of the invention, there is provided a network device comprising a routing information table incorporating a plural words therein, each word storing a routing information data and a mask information data corresponding to each one or more routing information data, the mask information data determining whether or not each bit string of the routing information data should be excluded as a retrieval data by setting bit state;

the network device comprising:
a primary retrieval means for comparing a destination network address in an input communication data with an output primary match signal to identify a matching word, wherein the destination network address is input as a primary retrieval data, outputting a primary match signal identifying a matching word, and outputting logical operation results among the routing information data in a matching word as an intermediate data;
a compressive operation means for compressing a bit width of the intermediate data to generate a secondary retrieval data;
a secondary retrieval means for storing second storage data in a manner to correspond to each word of the routing information data, the second storage data being derived by compressing the routing information data for word by word, the secondary retrieval means comparing the secondary retrieval data with the second storage data for word by word and outputting a secondary match signal identifying a matching word;
an invalidation means for generating a final match signal by altering the secondary match signal corresponding to the primary match signal to be in a mismatch state for word by word; and
a means for deciding a transfer address to output a communication data corresponding to the input communication data in accordance with the final match signal.

According to a twelfth aspect of the invention, there is provided a method for deciding a transfer address of a network device comprising a routing information table incorporating a plural words therein, each word storing a routing information data and a mask information data corresponding to each one or more routing information data, the mask information data determining whether or not each bit string of the routing information data should be excluded as a retrieval data by setting bit state;
the means comprising:
when a destination network address is input as a primary retrieval data, performing a primary retrieval for comparing the destination network address with the routing information data for word by word to generate logical operation results among the routing information data in a matching word as an intermediate data;
performing a logical operation for compressing a bit width of the intermediate data to generate a secondary retrieval data;
performing a secondary retrieval for comparing a logical operation results with the secondary retrieval data, the logical operation results being derived by compressing the routing information data in the one or more words matched in the primary retrieval; and
deciding a transfer address of an output communication data corresponding to the input communication data in accordance with the routing information data corresponding to the word matched in the secondary retrieval.

According to a thirteenth aspect of the invention, there is provided a network device comprising a routing information table incorporating plural words therein, each word storing a routing information data and a mask information data in pairs, the mask information data determining whether or not each bit string of the routing information data should be excluded as a retrieval data by setting bit state;
the network device comprising:
a primary retrieval means for comparing a destination network address in an input communication data with the routing information data for word by word, outputting a primary match signal identifying a matching word, wherein the destination network address is input as a primary retrieval data, and outputting logical operation results among the mask information data and the primary retrieval data in a matching word as an intermediate data;
a compressive operation means for compressing a bit width of the intermediate data to generate a secondary retrieval data;
a secondary retrieval means for storing second storage data in a manner to correspond to each word of the routing information data, the second storage data being derived by compressing the routing information data for word by word, the secondary retrieval means comparing the secondary retrieval data with the second storage data for word by word and outputting a secondary match signal identifying a matching word;
an invalidation means for generating a final match signal by altering the secondary match signal corresponding to the primary match signal to be in a mismatch state for word by word; and
a means for deciding a transfer address to output a communication data corresponding to the input communication data in accordance with the final match signal.

According to a fourteenth aspect of the invention, there is provided a method for deciding a destination address comprising a routing information table incorporating plural words therein, each word storing a routing information data and a mask information data in pairs, the mask information data determining whether or not each bit string of the routing information data should be excluded as a retrieval data by setting bit state;
the method comprising:
when a destination network address is input as a primary retrieval data, performing a primary retrieval for comparing the destination network address with the routing information data for word by word to generate logical operation results among the mask information data and the primary retrieval data in a matching word as an intermediate data;
performing a logical operation for compressing a bit width of the intermediate data to generate a secondary retrieval data;
performing a secondary retrieval for comparing a logical operation results with the secondary retrieval data, the logical operation results being derived by compressing the routing information data in the one or more words matched in the primary retrieval; and
deciding a transfer address of an output communication data corresponding to the input communication data in accordance with the routing information data corresponding to the word matched in the secondary retrieval.

According to a fifteenth aspect of the invention, there is provided a network device comprising a routing information table incorporating plural words therein, each word storing a routing information data and a mask information data determining whether or not each bit string of the routing information data should be excluded as a retrieval data by setting bit state;
the network device comprising:
a primary retrieval means for comparing a destination network address in an input communication data with the routing information data for word by word, outputting a primary match signal identifying a matching word, wherein the destination network address is input as a primary retrieval data, and outputting logical operation results among the mask information data in a matching word as an intermediate data;

a compressive operation means for compressing a bit width of the intermediate data to generate a secondary retrieval data;

a secondary retrieval means for storing second storage data in a manner to correspond to each word of the routing information data, the second storage data being derived by compressing the mask information data for word by word, the secondary retrieval means comparing the secondary retrieval data with the second storage data for word by word and outputting a secondary match signal identifying a matching word;

an invalidation means for generating a final match signal by altering the secondary match signal corresponding to the primary match signal to be in a mismatch state for word by word; and a means for deciding a transfer address to output a communication data corresponding to the input communication data in accordance with the final match signal.

According to a sixteenth aspect of the invention, there is provided a method for deciding a destination address comprising a routing information table incorporating plural words therein, each word storing a routing information data and a mask information data in pairs, the mask information data determining whether or not each bit string of the routing information data should be excluded as a retrieval data by setting bit state;

the method comprising:

when a destination network address is input as a primary retrieval data, performing a primary retrieval for comparing the destination network address with the routing information data for word by word to generate logical operation results among the mask information data in a matching word as an intermediate data;

performing a logical operation for compressing a bit width of the intermediate data to generate a secondary retrieval data;

performing a secondary retrieval for comparing a logical operation results with the secondary retrieval data, the logical operation results being derived by compressing the routing information data in the one or more words matched in the primary retrieval; and deciding a transfer address of an output communication data corresponding to the input communication data in accordance with the routing information data corresponding to the word matched in the secondary retrieval.

BRIEF DESCRIPTION OF THE DRAWINGS

FIG. 7 is a view for describing an operation of the associative memory illustrated in

FIG. 5.

DETAILED DESCRIPTION OF THE PREFERRED EMBODIMENTS

First Embodiment

Figure 1:
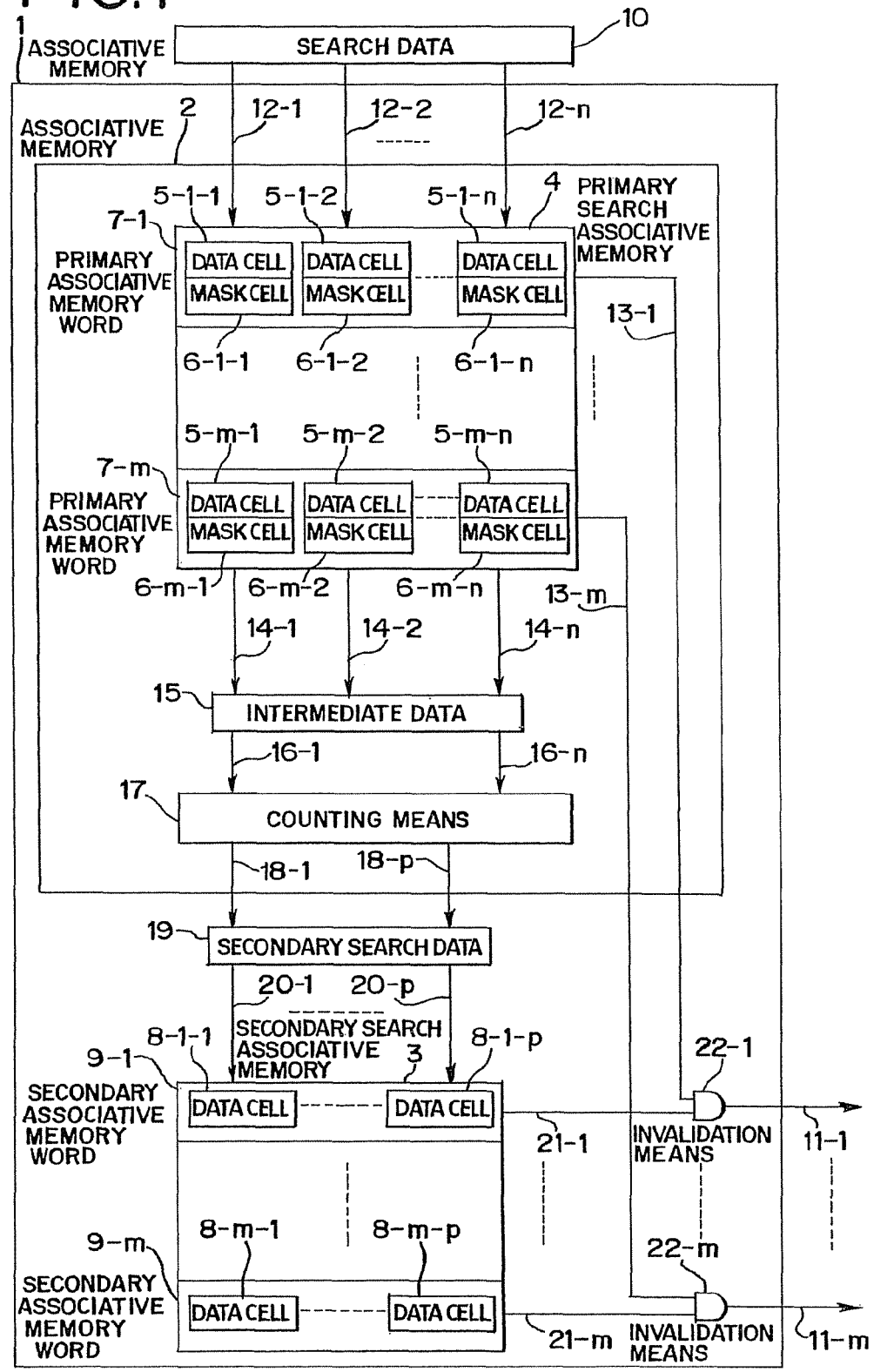
FIG. 1 is a block diagram of an associative memory according to a first embodiment of the present invention.

Now, description will be made in detail about a first preferred embodiment of the present invention with reference to the drawing. Referring to FIG. 1, an associative memory 1 according to a first embodiment of the present invention will be described. The associative memory 1 of a first through m-th words n-bit configuration (m and n are integer variables) comprises an associative memory 2 of a first through m-th words n-bit configuration, an associative memory 3 for secondary searching operation of a first through m-th words p-bit configuration (p is an integer variable between 1 and m, both inclusive), and invalidation means 22-1 through 22-$m$, m in number, and has primary bit lines 12-1 through 12-$n$ supplied with n-bit search data 10, and match lines 11-1 through 11-$m$, m in number for delivering the final result of the searching operation.

The associative memory 2 of a first through m-th words n-bit configuration comprises an associative memory 4 for primary searching operation of a first through m-th words n-bit configuration, and counting means 17, and is supplied with the primary bit lines 12-1 through 12-$n$, and delivers primary match lines 13-1 through 13-$m$ and counting output lines 18-1 through 18-$p$.

The associative memory 4 for primary searching operation comprises primary associative memory words 7-1 through 7-$m$ capable of storing structured data comprising storage data and mask information, each being n-bit, and is supplied with the primary bit lines 12-1 through 12-$n$, and delivers the primary match lines 13-1 through 13-$m$ and intermediate data lines 14-1 through 14-$n$. The primary associative memory word 7$j$ (j is an integer variable between 1 and m, both inclusive) comprises data cells 5-$j$-1 through 5-$j$-$n$ for storing n-bit storage data, and mask cells 6-$j$-1 through 6-$j$-$n$ for storing the corresponding n-bit mask information. Herein, when a digit of the structured data is represented by the symbol "*" as "don't care", the corresponding bit of the storage data is stored in the corresponding data cell 5 with an invalid state for the storage data, and the corresponding bit of the mask information is stored in the corresponding mask cell 6 with a valid state for the mask information. The associative memory 4 for primary searching operation carries out the primary searching operation to search one of the storage data coincident with the primary bit lines 12-1 through 12-$n$ taking the corresponding mask information into account, and puts the primary match line 13 corresponding to the primary associative memory word 7 which stores the coincident storage data into a valid state, and puts other primary match lines 13 into an invalid state. The associative memory 4 for primary searching operation also supplies a value obtained from a result of a logical sum operation, with a valid state for the storage data as true, of all coincident storage data to the intermediate data lines 14-1 through 14-n as n-bit intermediate data 15. As is understood from the drawing, the associative memory 4 for primary searching operation of a first through m-th words n-bit configuration in the first embodiment can completely be configured similar to the associative memory 103 for primary searching operation of the conventional associative memory 100 of a first through m-th words n-bit configuration referring to FIG. 13. A state of the n-bit intermediate data 15 is supplied to counting input lines 16-1 through 16-n, n in number.

The counting means 17 is supplied with the counting input lines 16-1 through 16-n, n in number and delivers counting output lines 18-1 through 18-p, p in number. The counting means 17 counts the number of bits of an invalid state for the intermediate data lasting from a bit location of the intermediate data 15 corresponding to the lowest hierarchy to the higher hierarchy of the network address until a first bit of a valid state for the intermediate data appears, and delivers the counting result to the counting output lines 18-1 through 18-p as p-bit secondary search data 19. The p-bit secondary search data 19 is supplied to secondary bit lines 20-1 through 20-p, p in number.

In this case, the minimum value of the counting result is 0 in decimal numbers and the maximum value thereof is n in decimal numbers. The lines, p in number of the counting output lines 18-1 through 18-p therefore become an integer variable to satisfy next Equation 1 when the counting result is coded into binary numbers.

$$P-1 \leq \text{Log}_2(n+1) \leq p \qquad \text{Equation 1}$$

If it is assumed that X is a positive real number, and a function Roundup (X) is defined as a function to round up the digits to the right of the decimal point of the positive real number X into an integer, then Equation 1 can be described as follows.

$$P = \text{Roundup} (\text{Log}_2(n+1)) \qquad \text{Equation 2}$$

For example, when the bit width n of the intermediate data 15 is 9 in decimal numbers, the bit width p of the secondary search data 19 becomes 4 in decimal numbers, and when the bit width n of the intermediate data 15 is 128 in decimal numbers, the bit width p of the secondary search data 19 becomes 8 in decimal numbers. A truth table of the counting means 17 which codes the counting result into binary numbers of four bits when the lines, n in number of the counting input lines 16-1 through 16-n is 9 in decimal numbers is shown in Table 1.

TABLE 1

| 9 bit input | | | | | | | | | 4 bit output | | | |
|---|---|---|---|---|---|---|---|---|---|---|---|---|
| * | * | * | * | * | * | * | * | 1 | 0 | 0 | 0 | 0 |
| * | * | * | * | * | * | * | 1 | 0 | 0 | 0 | 0 | 1 |
| * | * | * | * | * | * | 1 | 0 | 0 | 0 | 0 | 1 | 0 |
| * | * | * | * | * | 1 | 0 | 0 | 0 | 0 | 0 | 1 | 1 |
| * | * | * | * | 1 | 0 | 0 | 0 | 0 | 0 | 1 | 0 | 0 |
| * | * | * | 1 | 0 | 0 | 0 | 0 | 0 | 0 | 1 | 0 | 1 |
| * | * | 1 | 0 | 0 | 0 | 0 | 0 | 0 | 0 | 1 | 1 | 0 |
| * | 1 | 0 | 0 | 0 | 0 | 0 | 0 | 0 | 0 | 1 | 1 | 1 |
| 1 | 0 | 0 | 0 | 0 | 0 | 0 | 0 | 0 | 1 | 0 | 0 | 0 |
| 0 | 0 | 0 | 0 | 0 | 0 | 0 | 0 | 0 | 1 | 0 | 0 | 1 |

In Table 1, the symbol "*" represents "don't care".

As readily understood, the counting means can also be configured similarly other than when the lines, n in number of the counting input lines 16-1 through 16-n are 9. When the lines, n in number of the counting input lines 16-1 through 16-n are 64 in decimal numbers, the counting means 17 can be achieved using combinational circuits of about 8000 gates, and the signal delay is bout 4 ns when the associative memory is produced using 0.25 micron meter rule manufacturing process.

The associative memory 3 for secondary searching operation of a first through m-th words p-bit configuration is supplied with the secondary bit lines 20-1 through 20-p, and produces the secondary match lines 21-1 through 21-m. The associative memory 3 for secondary searching operation comprises the secondary associative memory words 9-1 through 9-m which can store p-bit secondary storage data. The j-th secondary associative memory word 9-j comprises the data cells 8-j-1 through 8-j-p for storing the p-bit secondary storage data. The associative memory 3 for secondary searching operation carries out a secondary searching operation to search secondary storage data coincident with the secondary bit lines 20-1 through 20-p, and puts a secondary match line 21 corresponding to the secondary associative memory word 9 which stores the coincident secondary storage data into a valid state, and puts other secondary match lines 21 into an invalid state. As is understood from the drawing, the associative memory 3 for secondary searching operation of a first through m-th words p-bit configuration in the first embodiment is completely similar to the conventional associative memory 104 for secondary searching operation of a first through m-th words n-bit configuration described using FIG. 13, except changing an n-bit per word configuration into a p-bit per word configuration.

The secondary associative memory words 9-1 through 9-m, m in number correspond one-to-one to the primary associative memory words 7-1 through 7-m, m in number. Although corresponding ways are arbitrary, the j-th secondary associative memory word 9-j corresponds to the j-th primary associative memory word 7-j in this embodiment. The data cells 8-j-1 through 8-j-p of the j-th secondary associative memory word 9-j store as the p-bit secondary storage data a p-bit operation result obtained from a result for the counting means 17 to carry out the same operation to the n-bit storage data stored in the corresponding primary associative memory word 7-j as the counting means 17 carries out to the n-bit counting input lines 16-1 through 16-n.

The j-th invalidation means 22-j is supplied with a secondary match line 21-j which the secondary associative memory word 9-j produces, and the primary match line 13-j which the primary associative memory word 7-j corresponding to the secondary associative memory word 9-j produces. The invalidation means 22-j puts the match line 11-j into an invalid state for the match line when the primary match line 13-j is an invalid state for the primary match line, and puts the match line 11-j into a state of the secondary match line 21-j when the primary match line 13-j is a valid state for the primary match line. The invalidation means 22-j comprises logical product operational circuits with a valid state for the primary match line and a valid state for the secondary match line as true in FIG. 1, as readily understood, it can comprise wired logical circuits or the like.

(Operation of the First Embodiment)

Next, referring to FIG. 2, description will be made about the operation when the above-mentioned associative memory 1 of the first embodiment according to the present invention is used in calculating the transfer network address in the network device 400-1 in FIG. 11. Accordingly, it is assumed that the associative memory 1 comprises a first through fifth words nine-bit configuration in FIG. 2. Since the bit width n of the search data 10 is nine bits, the associative memory 4 for primary searching operation in the associative memory 2 comprises a first through fifth words nine-bit configuration. Since the bit width n of the search data 10 is nine bits, the bit width p of the secondary search data 19 comprises four bits from Equation 1, and the associative memory 3 for secondary searching operation comprises a first through fifth words four-bit configuration. The counting means 17 converts the state of the nine-bit counting input lines 16-1 through 16-9 into a value of four bits according to Table 1 to supply to the counting output lines 18-1 through 18-4.

In the following description of this embodiment, a valid state and an invalid state for the mask information are represented by "0" and "1", respectively and a valid state and an invalid state for storage data are represented by "1" and "0", respectively. Similar to the storage data, a valid state and an invalid state are represented by "1" and "0", respectively, for the intermediate data lines 14-1 through 14-9. A valid state and an invalid state are represented by "1" and "0", respectively for the primary match lines 13-1 through 13-5, the secondary match lines 21-1 through 21-5, and the match lines 11-1 through 11-5.

Figure 11:
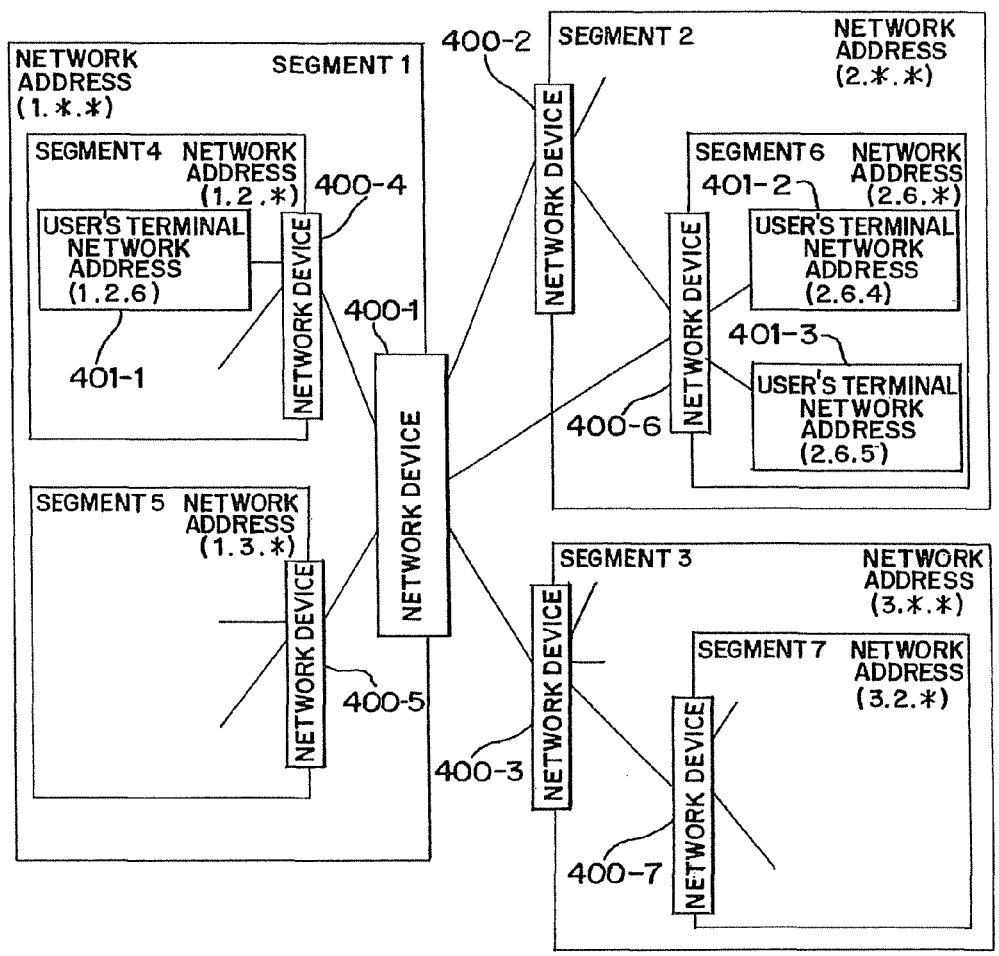
FIG. 11 is a view of a computer network connection.
Figure 12:
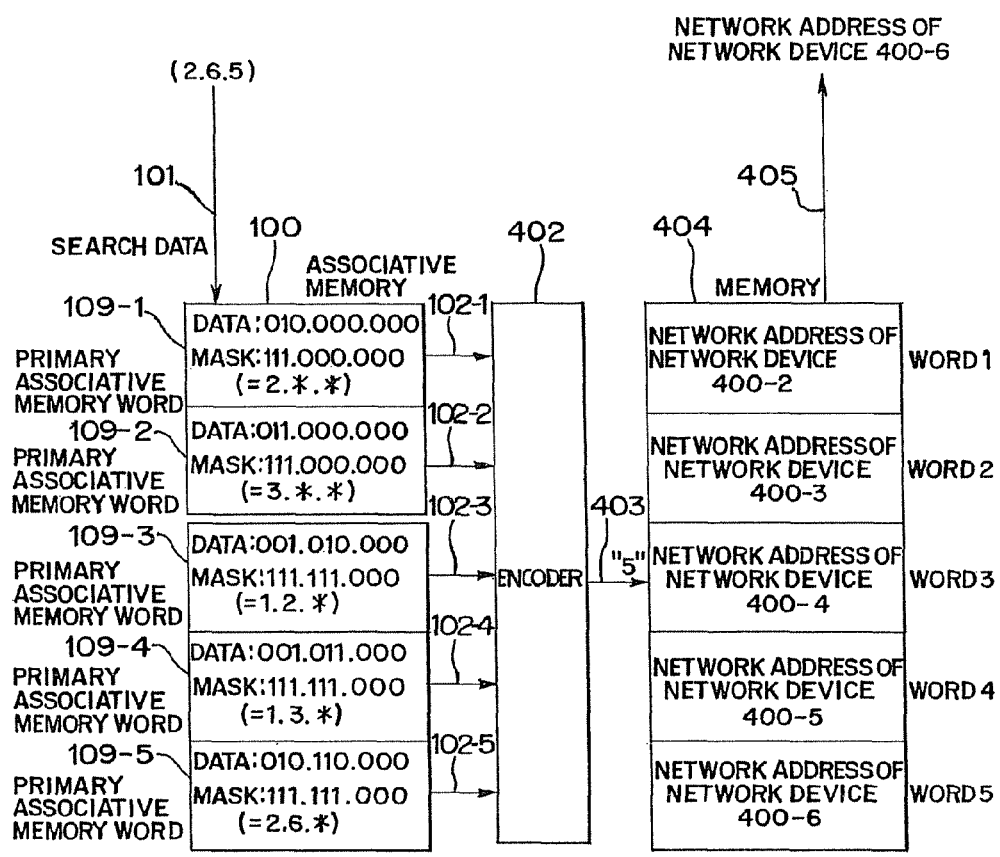
FIG. 12 is an explanatory diagram of calculating the transfer network address of the conventional network device.

The associative memory 1 memorizes the connection information of the network device 400-1 in FIG. 11 in each of the nine-bit primary associative memory words 7-1 through 7-5 as the storage data and the mask information. Herein, when a digit of a network address is represented by the symbol "*" as "don't care", the corresponding bit of the storage data is stored with an invalid state "0" for the storage data, and the corresponding bit of the mask information is stored with a valid state "0" for the mask information.

Specifically, the primary associative memory word 7-1 stores in binary numbers notation the storage data "010.000.000" and the mask information "111.000.000" to represent the network address (2.*.*) for a segment 2 in the form of structured data. Similarly, the primary associative memory word 7-2 stores in binary numbers notation the storage data "011.000.000" and the mask information "111.000.000" to represent the network address (3.*.*) for a segment 3 in the form of structured data. The primary associative memory word 7-3 stores in binary numbers notation the storage data "001.010.000" and the mask information "111.111.000" to represent the network address (1.2.*) for a segment 4 in the form of structured data. The primary associative memory word 7-4 stores in binary numbers notation the storage data "001.011.000" and the mask information "111.111.000" to represent the network address (1.3.*) for a segment 5 in the form of structured data. The primary associative memory word 7-5 stores in binary numbers notation the storage data "010.110.000" and the mask information "111.111.000" to represent the network address (2.6.*) for a segment 6 in the form of structured data.

In the meanwhile, each of the four-bit secondary associative memory words 9-1 through 9-5 stores as the secondary storage data a value of four bits into which the counting means 17 converts the value of the nine-bit storage data stored in the corresponding primary associative memory words 7-1 through 7-5 according to Table 1 as the counting means 17 carries out the operation to the nine-bit counting input lines 16-1 through 16-9, respectively. Accordingly, the secondary associative memory word 9-1 stores, as the secondary storage data, 7 in decimal numbers notation, "0111" in binary numbers notation obtained from a result of converting the storage data "010.000.000" stored in the primary associative memory word 7-1 according to Table 1. The secondary associative memory word 9-2 stores, as the secondary storage data, 6 in decimal numbers notation, "0110" in binary numbers notation obtained from a result of converting the storage data "011.000.000" stored in the primary associative memory word 7-2 according to Table 1. The secondary associative memory word 9-3 stores, as the secondary storage data, 4 in decimal numbers notation, "0100" in binary numbers notation obtained from a result of converting the storage data "001.010.000" stored in the primary associative memory word 7-3 according to Table 1. The secondary associative memory word 9-4 stores, as the secondary storage data, 3 in decimal numbers notation, "0011" in binary numbers notation obtained from a result of converting the storage data "001.011.000" stored in the primary associative memory word 7-4 according to Table 1. The secondary associative memory word 9-5 stores, as the secondary storage data, 4 in decimal numbers notation, "0100" in binary numbers notation obtained from a result of converting the storage data "010.110.000" stored in the primary associative memory word 7-5 according to Table 1.

Prior to the primary searching operation, all of the primary match lines 13-1 through 13-5 are precharged to a high level to be put into a valid state "1". Prior to the secondary searching operation, all of the secondary match lines 21-1 through 21-5 are also precharged to a high level to be put into a valid state "1".

Description will proceed to the searching operation by supplying as the search data 10 the network address (2.6.5), in octal numbers notation, of the user's terminal 401-3 in FIG. 11.

The value "010.110.101" in binary numbers notation of the nine-bit search data 10 is supplied to the nine primary bit lines 12-1 through 12-9, and the associative memory 4 for primary searching operation in the associative memory 2 carries out the primary searching operation. As a result, (2.*.*) in octal numbers notation stored in the primary associative memory word 7-1 and (2.6.*) in octal numbers notation stored in the primary associative memory word 7-5 are coincident with the search data on the primary bit lines 12-1 through 12-9. Accordingly, as a result of the primary searching operation, two primary match lines 13-1 and 13-5 are put into a valid state "1", and the remaining primary match lines 13-2, 13-3, and 13-4 are put into an invalid state "0".

Herein, the intermediate data line 14-1 produces the logical sum "0", with "1" as true, of the storage data "0", and "0" in the primary associative memory words 7-1 and 7-5 at bit positions corresponding to the intermediate data line 14-1. The intermediate data line 14-2 produces the logical sum "1", with "1" as true, of the storage data "1", and "1" in the primary associative memory words 7-1 and 7-5 at bit positions corresponding to the intermediate data line 14-2. Likewise, the intermediate data line 14-3, 14-4, 14-5, 14-6, 14-7, 14-8, and 14-9 produce the logical sum "0" of "0" and "0", logical sum "1" of "0" and "1", logical sum "1" of "0" and "1", logical sum "0" of "0" and "0", logical sum "0" of "0" and "0", logical sum "0" of "0" and "0", and logical sum "0" of "0" and "0", respectively, with "1" as true. Therefore, the nine-bit intermediate data 15 results in "010110000" in binary numbers notation, which is supplied to the counting input lines 16-1 through 16-9.

The counting means 17 delivers a value 4 in decimal numbers notation, "0100" in binary numbers notation obtained from a result of converting the state of the nine-bit counting input lines 16-1 through 16-9 according to Table 1 to the counting output lines 18-1 through 18-4 as the four-bit secondary search data 19.

The value of the secondary search data 19 is supplied to the secondary bit lines 20-1 through 20-4, and the associative memory 3 for secondary searching operation carries out the secondary searching operation. As a result, "0100" in binary numbers notation stored in the secondary associative memory words 9-3 and 9-5 are completely coincident with the state of the secondary bit lines 20-1 through 20-4. The secondary match lines 21-3 and 21-5 are therefore put into a valid state "1", and the remaining secondary match lines 21-1, 21-2, and 21-4 are put into an invalid state "0".

Since the primary match line 13-1 is put into a valid state "1" upon completion of the secondary searching operation, the invalidation means 22-1 delivers a state "0" of the secondary match line 21-1 to the match line 11-1. Since the primary match line 13-2 is put into an invalid state "0", the invalidation means 22-2 delivers an invalid state "0" to the match line 11-2. Since the primary match line 13-3 is put into an invalid state "0", the invalidation means 22-3 delivers an invalid state "0" to the match line 11-3. Since the primary match line 13-4 is put into an invalid state "0", the invalidation means 22-4 delivers an invalid state "0" to the match line 11-4. Since the primary match line 13-5 is put into a valid state "1", the invalidation means 22-5 delivers a state "1" of the secondary match line 21-5 to the match line 11-5. Only the match line 11-5 is therefore put into a valid state "1" upon completion of the secondary searching operation, and the remaining match lines 11-1, 11-2, 11-3, and 11-4 are put into an invalid state "0". It will therefore be understood that, in the match lines 11-1 through 11-5 corresponding to one of the storage data coincident with the search data 10 taking the mask information into account, the associative memory 1 of the first embodiment according to the present invention puts the only match line 11-5 corresponding to the storage data with the least number of bits in a mask valid state for the mask information into a valid state similar to the above-mentioned conventional associative memory 100.

Since the associative memory 1 of the first embodiment according to the present invention comprises the associative memory 4 for primary searching operation for carrying out the primary searching operation, and the associative memory 3 for secondary searching operation for carrying out the secondary searching operation independently as shown in FIG. 1 similar to the conventional associative memory 100, even when one clock time is required for primary searching operation and the secondary searching operation, respectively, by a clock signal (not shown), it is possible to carry out the calculation of the transfer network address by supplying the search data 10 for every clock.

Figure 13:
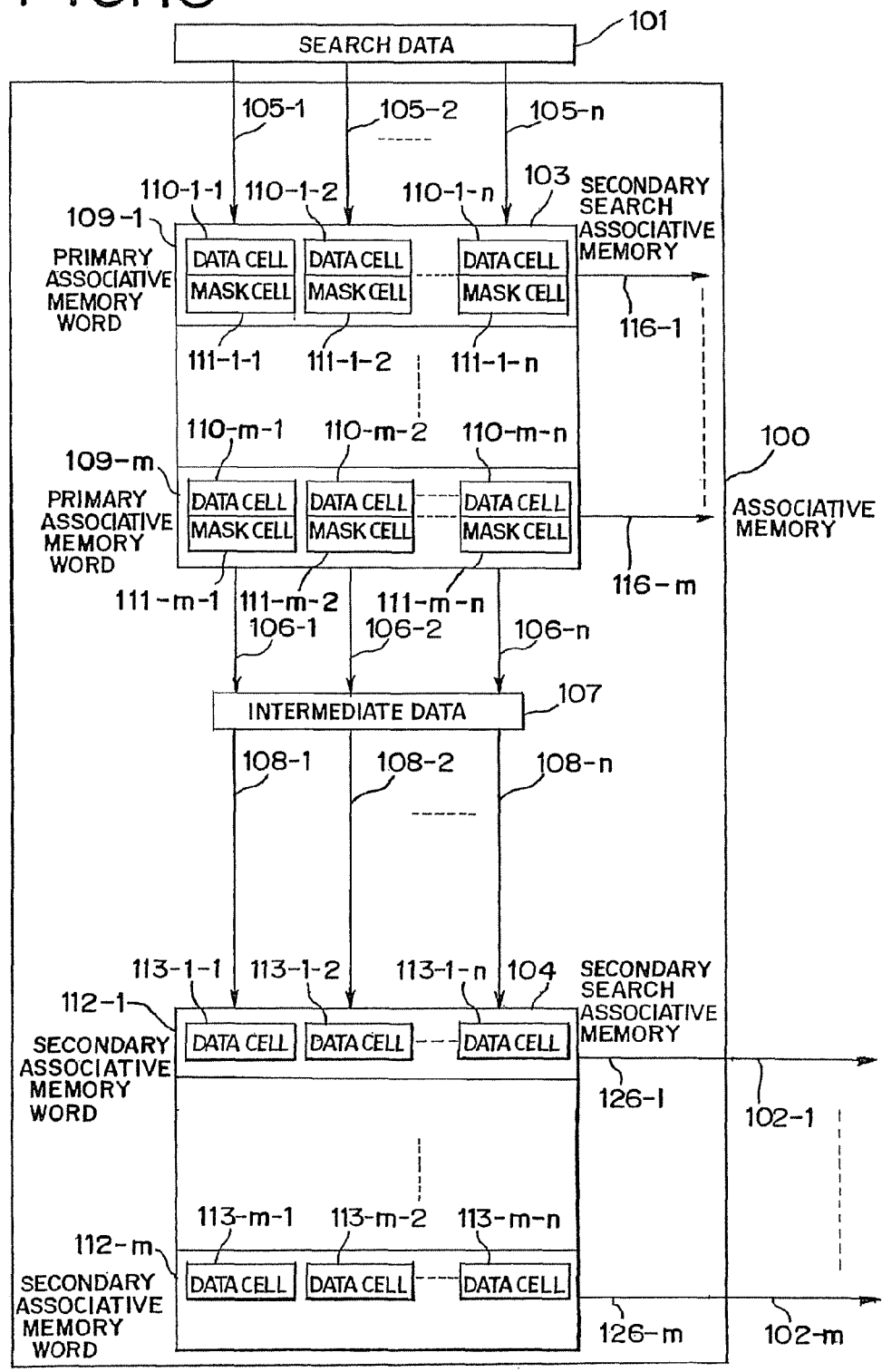
FIG. 13 is a block diagram of the conventional associative memory.
Figure 14:
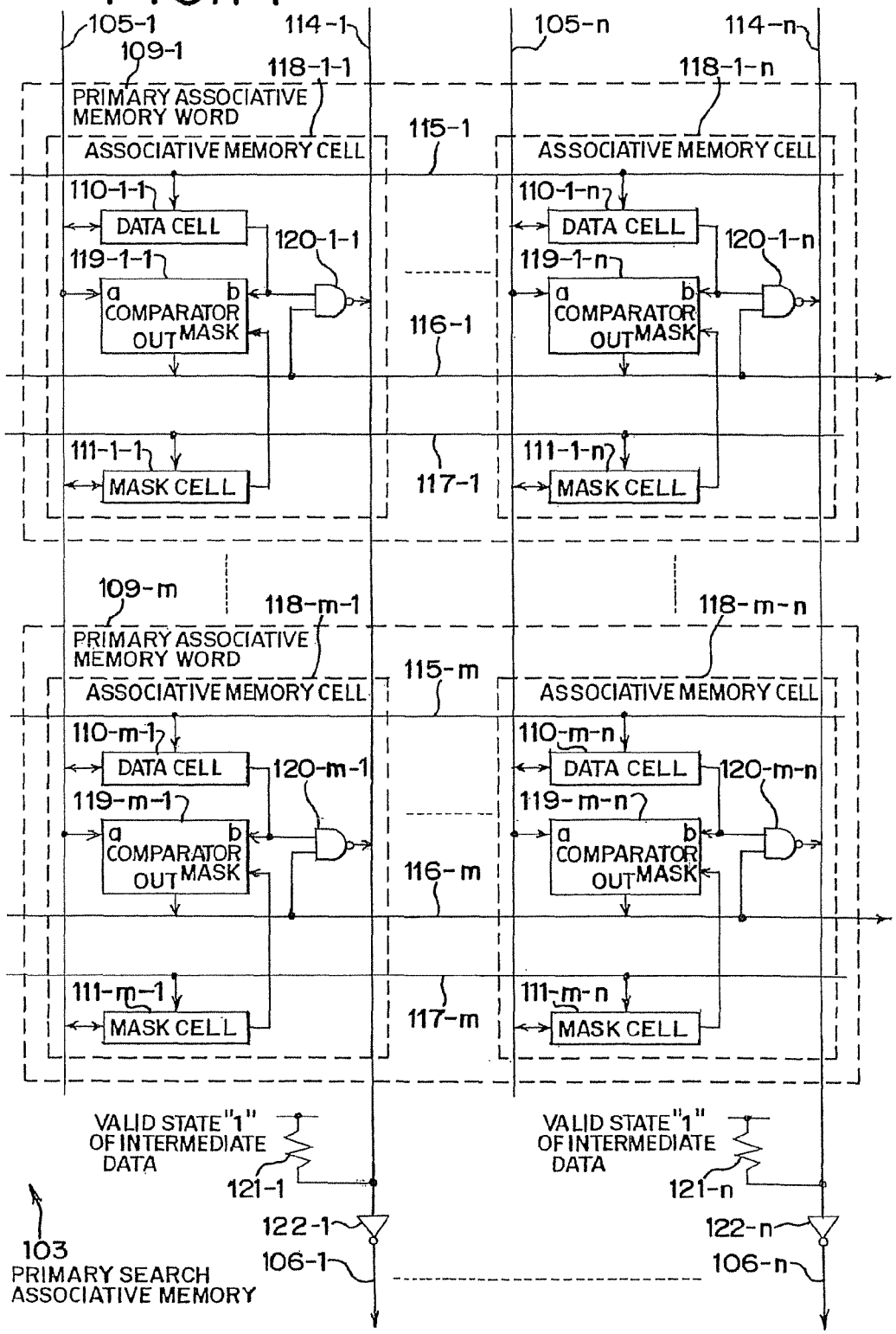
FIG. 14 is a block diagram of a primary associative memory illustrated in FIG. 13.
Figure 15:
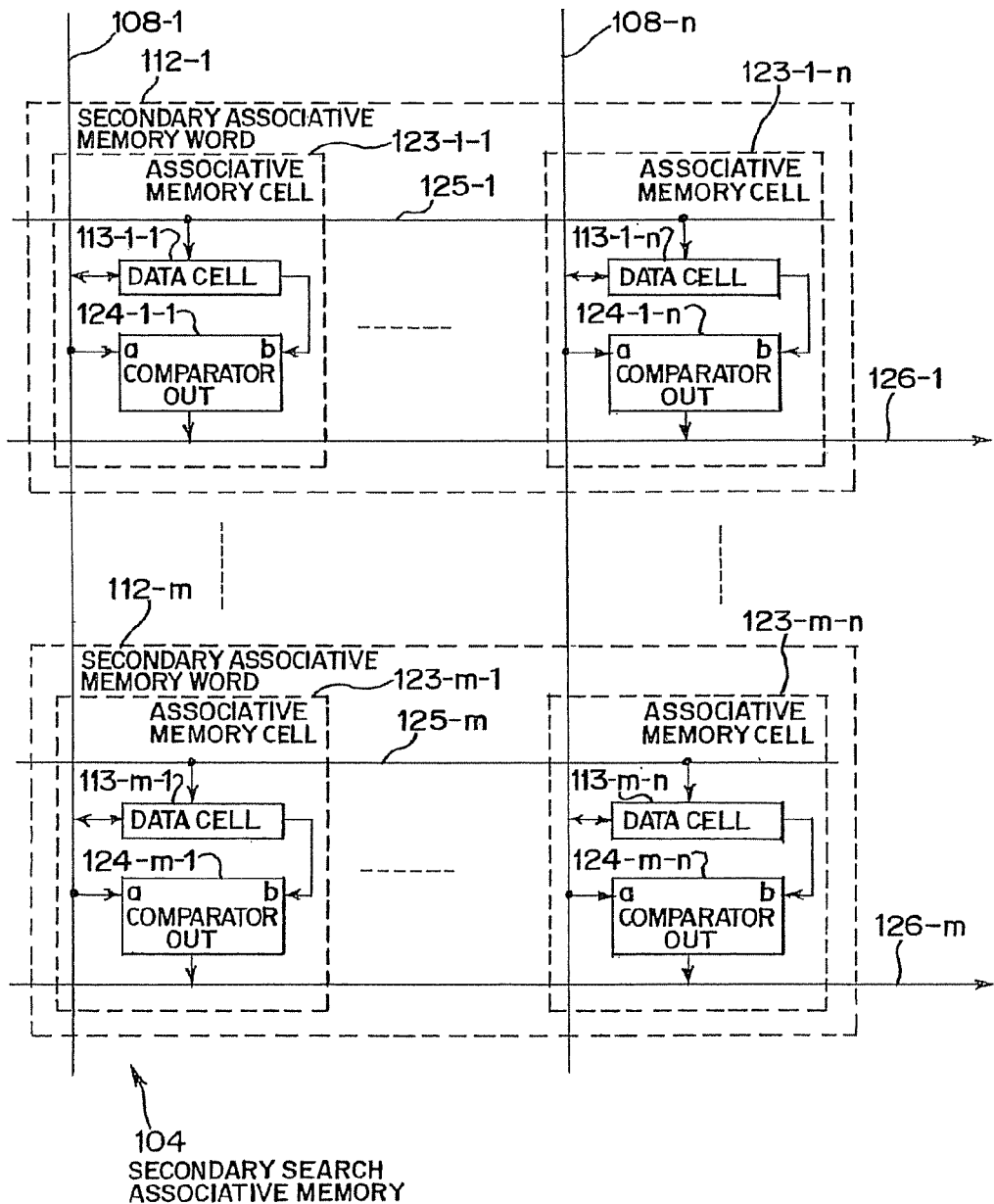
FIG. 15 is a block diagram of a secondary associative memory illustrated in FIG. 13.
Figure 16:
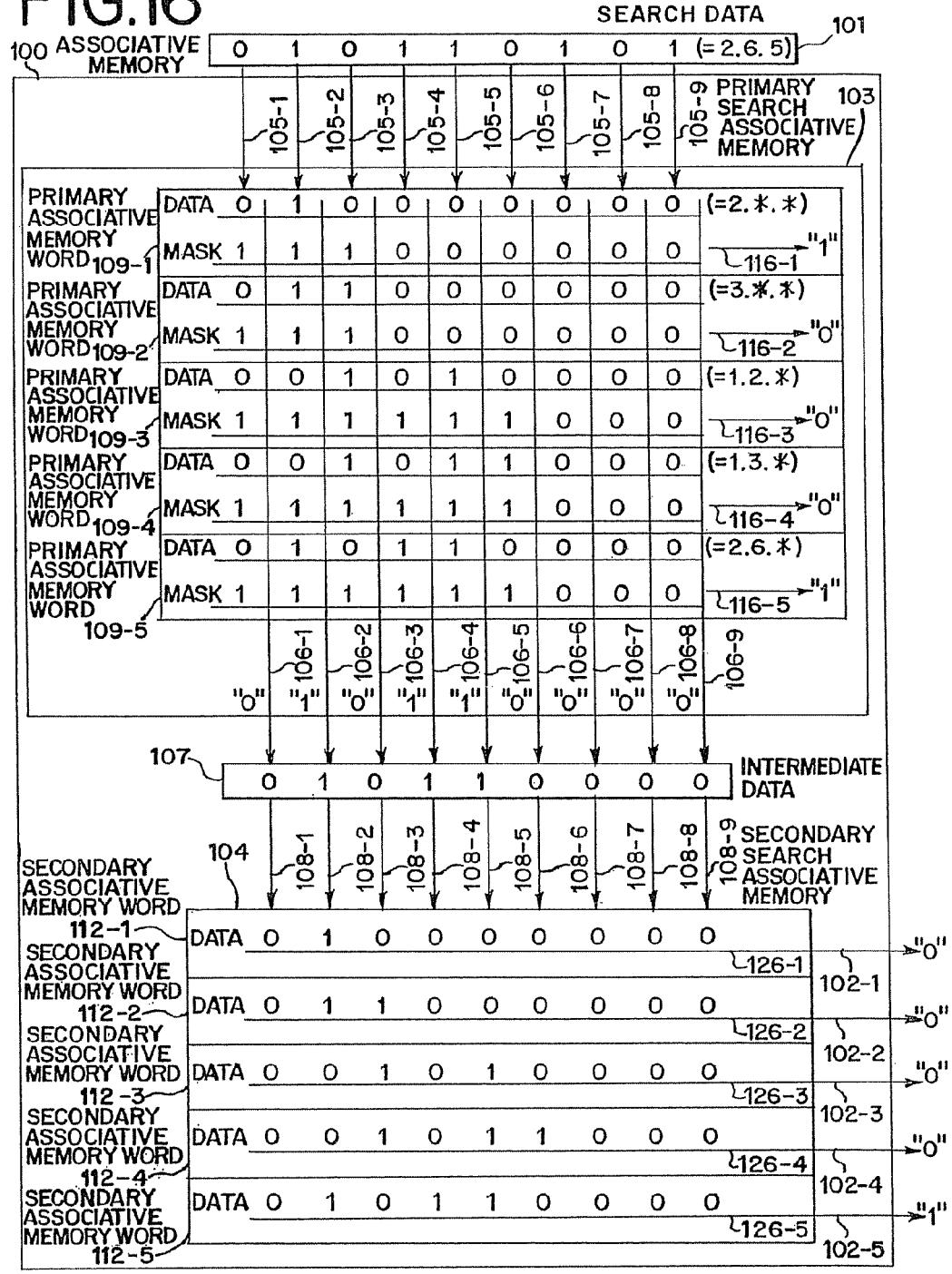
FIG. 16 is a view for describing an operation of the associative memory in FIG. 13.

Herein, when comparing components of the conventional associative memory 100 shown in FIG. 13 with those of the associative memory 1 shown in FIG. 1, although both the associative memory 103 for primary searching operation and the associative memory 4 for primary searching operation for carrying out the primary searching operation and generating the intermediate data are the same to comprise a first through m-th words n-bit configuration, except changing the associative memory 104 for secondary searching operation of a first through m-th words n-bit configuration to the associative memory 3 for secondary searching operation of a first through m-th words p-bit configuration, and adding the n-bit counting means 17 and the invalidation means 22-1 through 22-$m$, m in number thereto.

If it is assumed that the circuit area of each MOS transistor that composes the comparator 119, the comparator 124, and the logical gate 120 is 10 times as large as the circuit area of the minimum MOS transistor in the conventional associative memory 100 as described above, and if it is further assumed that the comparator 119 comprises four MOS transistors, the comparator 120 comprises three MOS transistors, and the logical gate 120 comprises two MOS transistors, then the circuit area of the associative memory cell 118 that composes the associative memory 103 for primary searching operation is 72 times as large as the circuit area of the minimum MOS transistor, and the circuit area of the associative memory cell 123 that composes the associative memory 104 for secondary searching operation is 36 times as large as the circuit area of the minimum MOS transistor.

The configuration per bit of the associative memory 4 for primary searching operation and the associative memory 3 for secondary searching operation in the associative memory 1 are similar to those of the associative memory 103 for primary searching operation and the associative memory 104 for secondary searching operation in the conventional associative memory 100, respectively, as described above. Accordingly, in a case of the first through 32768th 64-bit associative memory words, the circuit area of the associative memory 4 for primary searching operation is 150,994,944 times as large as the circuit area of the minimum MOS transistor. In the meanwhile, since the secondary associative memory comprises the first through 32768th seven-bit associative memory words from Equation 1, the circuit area of the associative memory 3 for secondary searching operation is 8,257,536 times as large as the circuit area of the minimum MOS transistor. The counting means 17 can be comprised of about 8000 gates of 64-bit intermediate data line as described above, and if it is assumed that one gate is comprised of four minimum circuit area MOS transistors, then the circuit area of the counting means 17 is 32,000 times as large as the circuit area of the minimum MOS transistor. The invalidation means 22 can also be comprised of logical AND gates, and if it is assumed that one logical AND gate is comprised of six minimum circuit area MOS transistors, then the total circuit area of the 32,678 invalidation means 22 is 196,068 times as large as the circuit area of the minimum MOS transistor.

As described above, the circuit area of the invalidation means 22 and the counting means 17 is so small when compared with the circuit area of the associative memory 4 for primary searching operation and the associative memory 3 for secondary searching operation as to be negligible. Accordingly, if it is assumed that the circuit area of the conventional associative memory 100 is normalized as 1, then the circuit area in the whole chip of associative memory 1 is represented by next Equation 3. Herein, Equation 3 is represented using the above-mentioned Roundup (X) function which rounds up the digits right to the decimal point of the positive real number X into an integer.

$$(72 \times n + 36 \times \text{Roundup} (\text{Log}_2(n+1)))/((72+36) \times n) \qquad \text{Equation 3}$$

From Equation 3, when the bit width n of the search data 10 is 64 bits, the circuit area of the associative memory 1 is about 70.3% as the circuit area of the conventional associative memory 100, and the area is reducible by about 31%. Consequently, having the same chip area as that of the conventional associative memory 100, the associative memory 1 of the present invention can increase the storage capacity by about 42.2%. Further, as readily understood from Equation 3, the larger the bit width n of the search data 10 becomes, the larger the circuit area reduction effect of the present invention becomes. For example, when the bit width n of the search data 10 is 128 bits, the circuit area of the associative memory 1 becomes about 68.8% as large as that of the conventional associative memory 100.

In the meanwhile, only the primary match lines, n in number which is the same as the bit length of the mask information among the primary match lines 13-1 through 13-$m$, m in number maintain a valid state upon completion of the primary searching operation at the maximum similar to the conventional associative memory 103 for primary searching operation, and the remaining primary match lines, (m−n) in number discharge the charge that has been precharged to a valid state before the searching operation. When the associative memory 1 comprises the first through 32768th 64-bit associative memory words using 0.25 micron meter rule manufacturing process, the parasitic capacitance of the primary match line 13 per line is about 0.3 pF as described above. Consequently, if it is assumed that the supplied voltage is 2.5 V and the period of the searching operation is 20 ns, then the minimum value of the total power consumption required for precharging 32,768 primary match lines 13 is 3.07 W as given by (0.3 pF×2.5 V)÷20 ns×2.5 V×(32768−64) lines=3.07 W.

The power consumption of the associative memory 4 for primary searching operation in the associative memory 1 of the first embodiment according to the present invention is therefore almost the same as the power consumption of the associative memory 103 for primary searching operation of the conventional associative memory 100.

In the meanwhile, the power consumption of the associative memory 104 for secondary searching operation of the conventional associative memory 100 comprising the first to 32768th 64-bit associative memory words, which is required to precharge the lines, (m−1) in number of the secondary match lines 21 at the maximum having the same parasitic capacitance as that of the primary match line 13 as described above, is 3.07 W as given by (0.3 pF×2.5 V)÷20 ns×2.5 V×(32768−1) lines=3.07 W.

In the associative memory 3 for secondary searching operation of the associative memory 1 of the present invention, minimum one line, maximum lines, m in number among the secondary match lines 21-1 through 21-$m$, maintain a valid state upon completion of the secondary searching operation, and maximum lines, (m−1) in number, minimum zero line among the secondary match lines 21-1 through 21-$m$ discharge the charge that has been precharged to a valid state before the secondary searching operation. In the meanwhile, the parasitic capacitance per line of the secondary match line 21 is proportional to the bit width p of the associative memory 3 for secondary searching operation. Consequently, when the associative memory 1 comprises the first through 32768th 64-bit associative memory words using 0.25 micron meter rule manufacturing process, if it is assumed that the supply voltage is 2.5 V and the period of the searching operation is 20 ns, then the maximum value of the total power consumption required for precharging 23,768 lines of the secondary match lines 21 is 0.34 W as given by (0.3 pF×2.5 V)÷20 ns×2.5 V×7/64×(32768−1) lines=0.34 W.

Herein, since the number of words m of the associative memory 1 is very large compared with the bit width n as described above, an approximation of (m−n)≈(m−1) is achieved. Accordingly, if it is assumed that the power consumption of the conventional associative memory 100 is normalized as 1, then the power consumption of the whole chip of associative memory 1 is represented by next Equation 4. Herein, Equation 4 is represented using the above-mentioned Roundup (X) function which rounds up the digits right to the decimal point of the positive real number X into an integer.

$$(1+\text{Roundup}(\log_2(n+1))/n)/2 \quad \text{Equation 4}$$

From Equation 4, when the bit width n of the search data 10 is 64 bits, the power consumption of the associative memory 1 is about 55.4% as the power consumption of the conventional associative memory 100, and the power consumption is reducible by about 44.5%. Further, as readily understood from Equation 4, the larger the bit width n of the search data 10 becomes, the larger the power consumption reduction effect of the present invention becomes. For example, when the bit width n of the search data 10 is 128 bits, the power consumption of the associative memory 1 becomes about 53.1% as that of the conventional associative memory 100.

Herein, when all bits of the n-bit intermediate data 15 in FIG. 1 are not simultaneously put into an invalid state, namely, when the associative memory 4 for primary searching operation does not store such structured data that all bits of the mask information are put into a mask valid state, the minimum value of the counting result is then 0 in decimal numbers and the maximum value thereof is (n−1) in decimal numbers. The lines, p in number of the counting output lines 18-1 through 18-$p$ therefore become an integer variable to satisfy next Equation 5 when the counting result is coded into binary numbers.

$$p=\text{Roundup}(\log_2(n)) \quad \text{Equation 5}$$

For example, when the bit width n of the intermediate data 15 is 128 in decimal numbers, the bit width p of the secondary search data 19 becomes 7 in decimal numbers. Consequently, the bit width of the associative memory 3 for secondary searching operation is more reducible than that based on Equation 1, and it is possible to further reduce the whole circuit area and power consumption of the associative memory 1.

As a matter of course, a method for the counting means 17 to code the counting result into the secondary search data 19 is arbitrary without being limited to coding it into the binary numbers. The bit width p of the secondary search data 19 in that case is determined not by Equations 1 and 5 but by the coding method.

Further, although the associative memory in this embodiment comprises so that one of the mask information may correspond to one of the storage data it cannot be overemphasized that the associative memory may comprise so that one of the mask information corresponds to a plurality of storage data.

Further, since a bit location of the intermediate data 15 corresponding to the lowest hierarchy of the network address and a bit location of the intermediate data 15 corresponding to the highest hierarchy are defined as the intermediate data line 14-$n$ and the intermediate data line 14-1, respectively, in this embodiment, although the counting means 17 counts the number of bits of an invalid state for the intermediate data lasting from the intermediate data line 14-$n$ to the higher bit line, it cannot be overemphasized that the lowest hierarchy and the highest hierarchy of the network address may correspond to an arbitrary bit location of the intermediate data 15, respectively.

Second Embodiment

Figure 3:
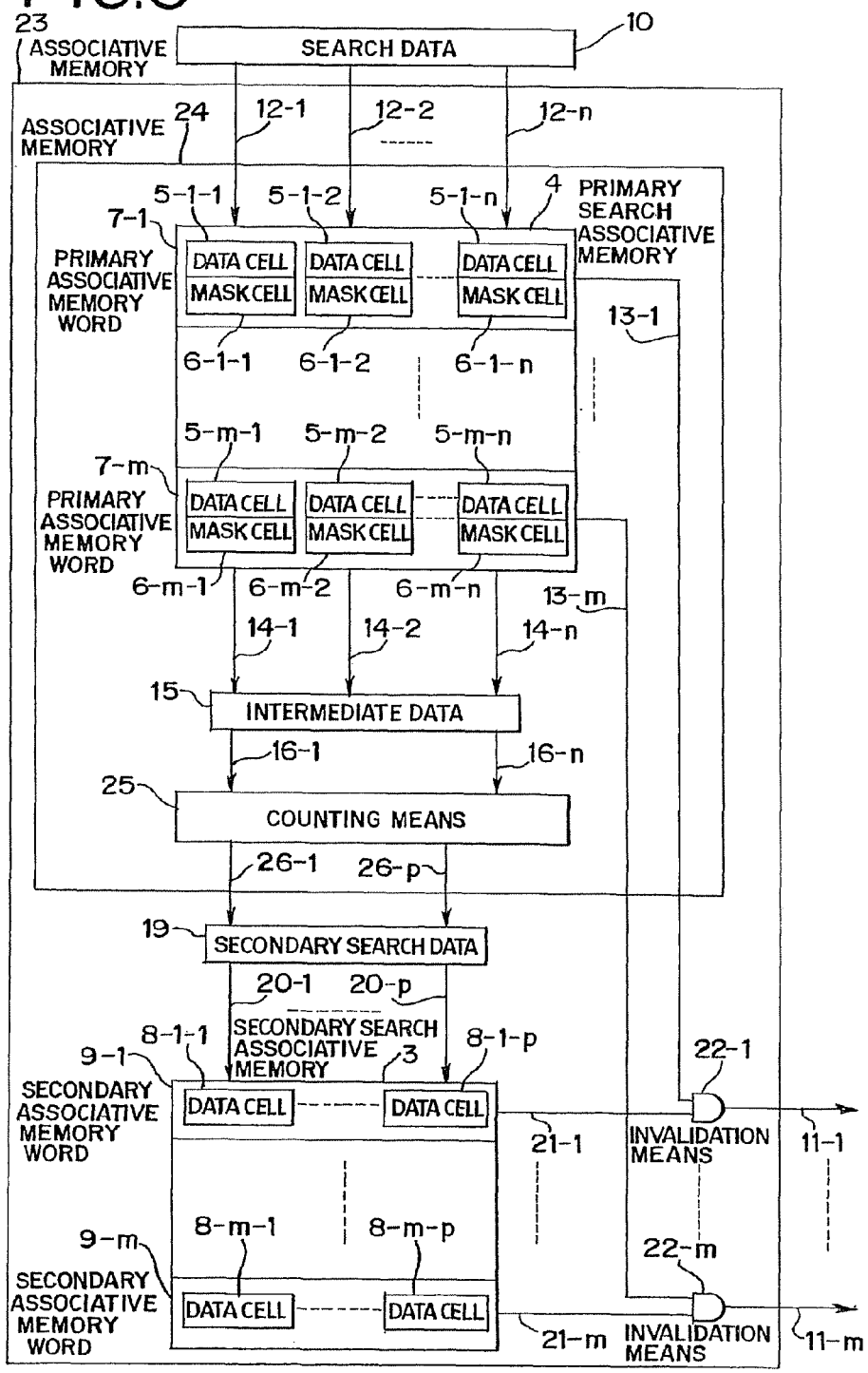
FIG. 3 is a block diagram of an associative memory according to a second embodiment of the present invention.
Figure 4:
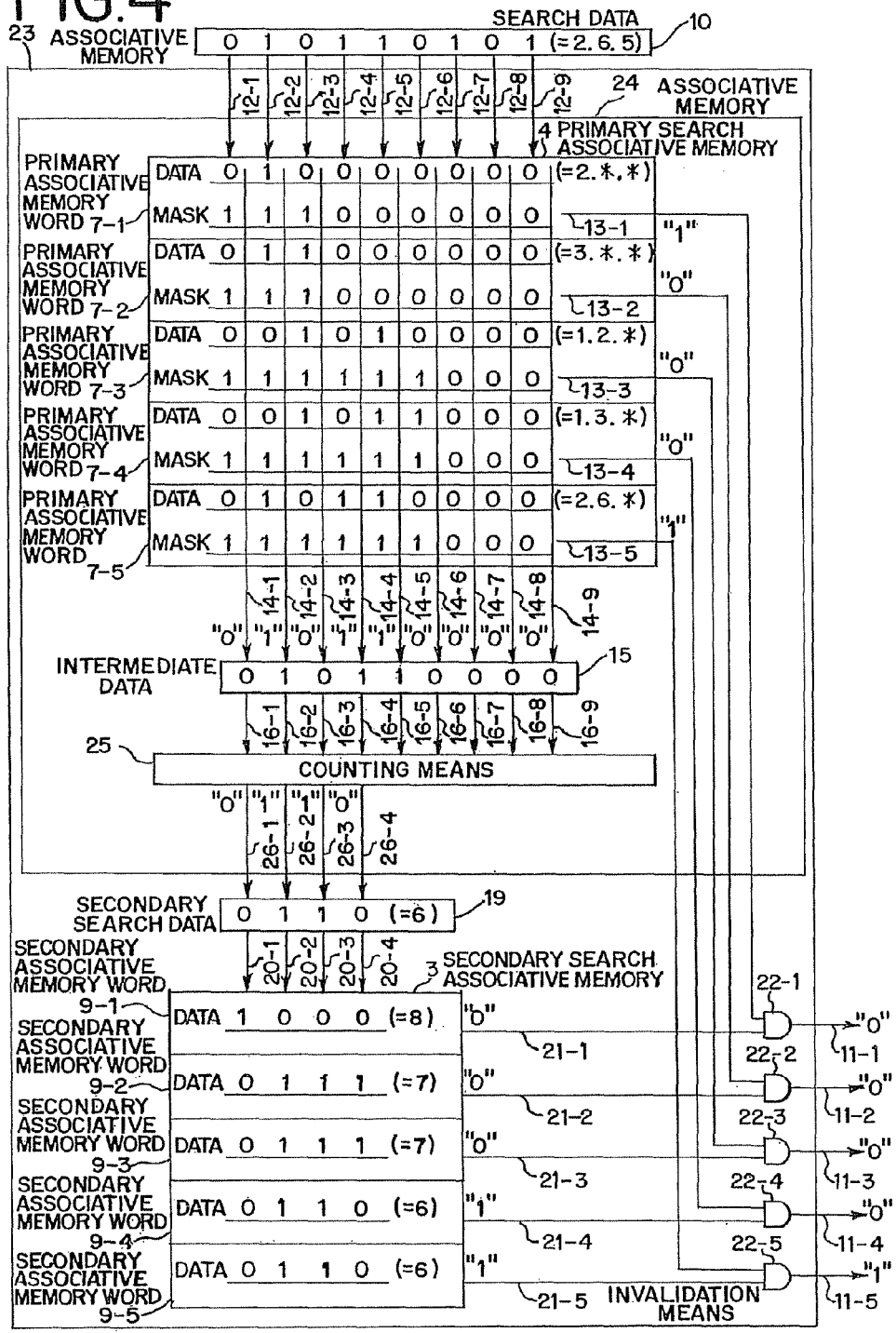
FIG. 4 is a view for describing an operation of the associative memory in FIG. 3.

Next referring to FIG. 3 and FIG. 4, description will be made about an associative memory 23 according to a second embodiment of the present invention. FIG. 3 is a block diagram showing an associative memory 23 of a first through m-th words n-bit configuration (m and n are integer variables) in the second embodiment of the present invention. Components of the associative memory 23 of a first through m-th words n-bit configuration of this embodiment are similar to those of the associative memory 1 of a first through m-th words n-bit configuration of the first embodiment, except changing the associative memory 2 into an associative memory 24, changing the counting means 17 which is the component of the associative memory 24 into a counting means 25, and because of it, changing symbols of output lines of the counting means 25 to counting output lines 26-1 through 26-*p* (p is an integer variable between 1 and n, both inclusive). Specifically, only the counting means 25 among the components of the associative memory 23 of this embodiment is changed from the counting means 17 in the associative memory 1 of the first embodiment. Therefore, description will be directed only to those components different from those of the first embodiment.

The counting means 25 of this embodiment is supplied with the n-bit intermediate data 15 of counting input lines 16-1 through 16-*n*, and produces the p-bit secondary search data 19 on the counting output lines 26-1 through 26-*p*, p in number. The counting means 17 according to the first embodiment counts the number of bits of an invalid state for the intermediate data lasting from a bit location of the intermediate data 15 corresponding to the lowest hierarchy to the higher hierarchy of the network address until a first bit of a valid state for the intermediate data appears, and the counting means 25 of this embodiment simply counts the number of lines to which an invalid state for intermediate data is supplied among the counting input lines 16-1 through 16-*n*. In this case, the minimum value of the counting result is 0 in decimal numbers and the maximum value thereof is n in decimal numbers. The lines, p in number of the counting output lines 26-1 through 26-*p* therefore become an integer variable to satisfy above-mentioned Equation 1 when the counting result is coded into binary numbers. The p-bit secondary search data 19 is supplied to the secondary bit lines 20-1 through 20-*p*, p in number.

The associative memory 3 for secondary searching operation of a first through m-th words p-bit configuration comprises the p-bit width secondary associative memory words 9-1 through 9-*m*, m in number. The secondary associative memory words 9-1 through 9-*m*, min number correspond one-to-one to the primary associative memory words 7-1 through 7-*m*, m in number. Although corresponding ways are arbitrary, the j-th (j is an integer variable between 1 and m, both inclusive) secondary associative memory word 9-*j* corresponds to the j-th primary associative memory word 7-*j* in this embodiment. The data cells 8-*j*-1 through 8-*j*-*p*, p in number of the j-th secondary associative memory word 9-*j* store as the p-bit secondary storage data a p-bit operation result obtained from a result for the counting means 25 to carry out the same operation to the n-bit storage data stored in the corresponding primary associative memory word 7-*j* as the counting means 25 carries out to the n-bit counting input lines 16-1 through 16-*n*. Specifically, the data cells 8-*j*-1 through 8-*j*-*p*, p in number of the j-th secondary associative memory word 9-*j* store as the secondary storage data a total number of bits with an invalid state for the storage data among the n-bit storage data stored in the corresponding primary associative memory word 7-*j*.

(Operation of the Second Embodiment)

Next, referring to FIG. 4, description will be made about the operation when the above-mentioned associative memory 23 of the second embodiment according to the present invention is used in calculating the transfer network address in the network device 400-1 in FIG. 11. Accordingly, in the matter similar to the operation of the associative memory 1 in the first embodiment in FIG. 2, the associative memory 23 comprises a first through fifth words nine-bit configuration in FIG. 4. Since the bit width n of the search data 10 is nine bits, the associative memory 4 for primary searching operation in the associative memory 24 comprises a first through fifth words nine-bit configuration. Since the bit width n of the search data 10 is nine bits, the bit width p of the secondary search data 19 comprises four bits from Equation 1, and the associative memory 3 for secondary searching operation comprises a first through fifth words four-bit configuration.

Figure 2:
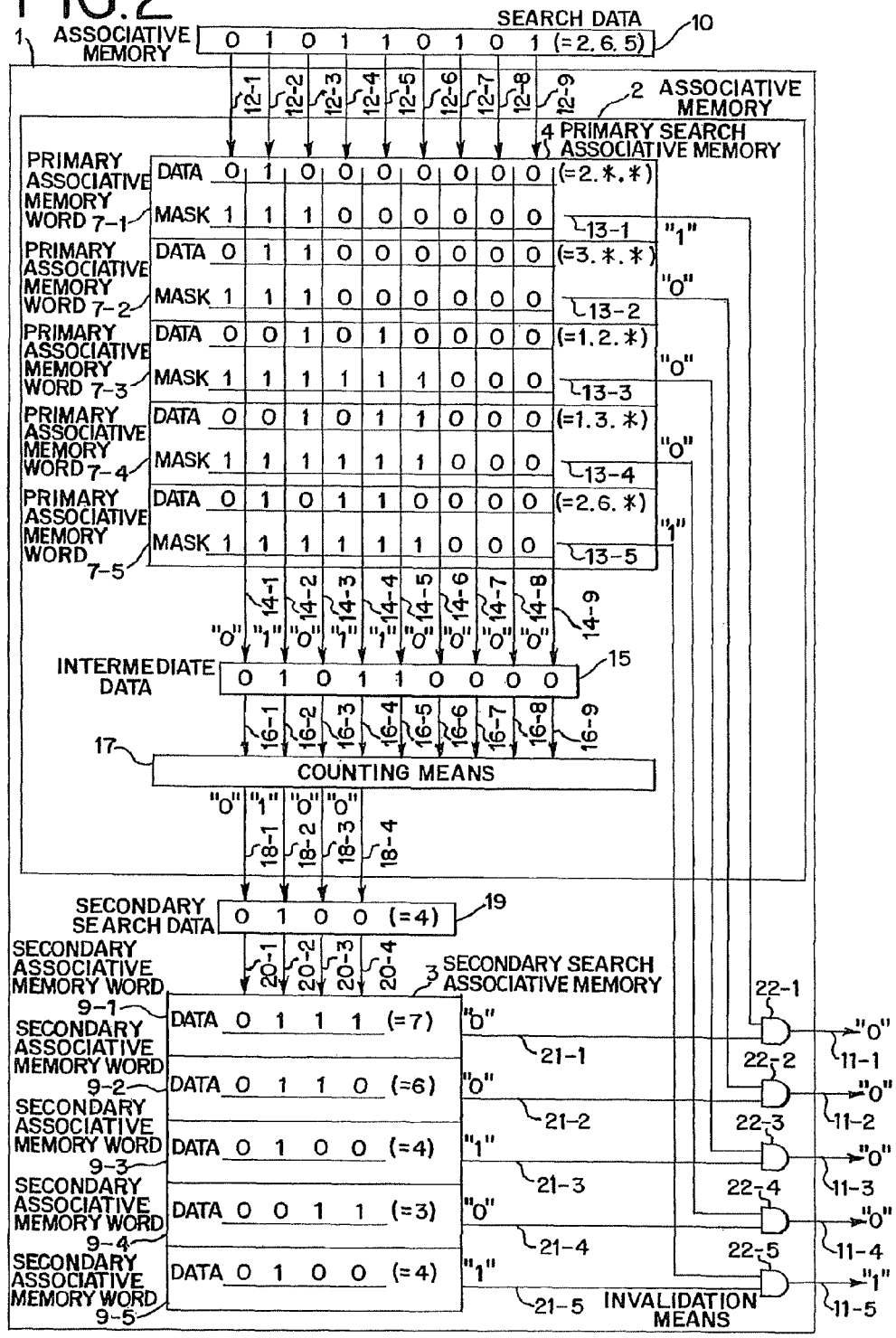
FIG. 2 is a view for describing an operation of the associative memory in FIG. 1.

Incidentally, in the matter similar to the discussion of the operation of the associative memory 1 in the first embodiment in FIG. 2, a valid state and an invalid state for the mask information are represented by "0" and "1", respectively and a valid state and an invalid state for storage data are represented by "0" and "1", respectively. Similar to the storage data, a valid state and an invalid state are represented by "1" and "0", respectively, for the intermediate data lines 14-1 through 14-9. A valid state and an invalid state are represented by "1" and "0", respectively for the primary match lines 13-1 through 13-5, the secondary match lines 21-1 through 21-5, and the match lines 11-1 through 11-5.

In the matter similar to the discussion of the operation of the associative memory 1 in the first embodiment in FIG. 2, the associative memory 23 memorizes the connection information of the network device 400-1 in FIG. 11 in each of the nine-bit primary associative memory words 7-1 through 7-5 as the storage data and the mask information. Herein, when a digit of a network address is represented by the symbol "*" as "don't care", the corresponding bit of the storage data is stored with an invalid state "0" for the storage data, and the corresponding bit of the mask information is stored with a valid state "0" for the mask information.

In the meanwhile, each of the four-bit secondary associative memory words 9-1 through 9-5 stores as the secondary storage data a result obtained from a result for the counting means 25 to calculate the number of the bits with an invalid state "0" for the storage data among the storage data stored in the corresponding primary associative memory words 7-1 through 7-5 as the counting means 25 carries out the operation to the nine-bit counting input lines 16-1 through 16-9, respectively. Accordingly, the secondary associative memory word 9-1 stores, as the secondary storage data, 8 in decimal numbers notation, "1000" in binary numbers notation which is a total number of bits of an invalid state "0" for the storage data in the storage data "010.000.000" stored in the primary associative memory word 7-1. The secondary associative memory word 9-2 stores, as the secondary storage data, 7 in decimal numbers notation, "0111" in binary numbers notation which is a total number of bits of an invalid state "0" for the storage data in the storage data "011.000.000" stored in the primary associative memory word 7-2. The secondary associative memory word 9-3 stores, as the secondary storage data, 7 in decimal numbers notation, "0111" in binary numbers notation which is a total number of bits of an invalid state "0" for the storage data in the storage data "001.010.000" stored in the primary associative memory word 7-3. The secondary associative memory word 9-4 stores, as the secondary storage data, 6 in decimal numbers notation, "0110" in binary numbers notation which is a total number of bits of an invalid state "0" for the storage data in the storage data "001.011.000" stored in the primary associative memory word 7-4. The secondary associative memory word 9-5 stores, as the secondary storage data, 6 in decimal numbers notation, "0110" in binary numbers notation which is a total number of bits of an invalid state "0" for the storage data in the storage data "010.110.000" stored in the primary associative memory word 7-5.

Prior to the primary searching operation, all of the primary match lines 13-1 through 13-5 are precharged to a high level to be put into a valid state "1". Prior to the secondary searching operation, all of the secondary match lines 21-1 through 21-5 are also precharged to a high level to be put into a valid state "1". Description will proceed to the searching operation by supplying as the search data 10 the network address (2.6.5), in octal numbers notation, of the user's terminal 401-3 in FIG. 11. Herein, description will be directed only to operations different from the associative memory 1 of the first embodiment in FIG. 2.

The value "010.110.101" in binary numbers notation of nine bits of the search data 10 is supplied to the nine primary bit lines 12-1 through 12-9, and the associative memory 4 for primary searching operation in the associative memory 24 carries out the primary searching operation. As a result of the primary searching operation, two primary match lines 13-1 and 13-5 are put into a valid state "1", and the remaining primary match lines 13-2, 13-3, and 13-4 are put into an invalid state "0" similar to the operation of the associative memory 1 of the first embodiment in FIG. 2. In the meanwhile, the nine-bit intermediate data 15 on the intermediate data lines 14-1 through 14-9 results in "010110000" in binary numbers notation, which is supplied to the counting input lines 16-1 through 16-9.

The counting means 25 counts the number of lines to which an invalid state "0" of the intermediate data is supplied among the nine-bit counting input lines 16-1 through 16-9. The counting means 25 produces 6 in decimal numbers notation, "0110" in binary numbers notation obtained from above calculation result to the counting output lines 26-1 through 26-4 as the four-bit secondary search data 19.

The value of the secondary search data 19 is supplied to the secondary bit lines 20-1 through 20-4, and the associative memory 3 for secondary searching operation carries out the secondary searching operation. As a result, "0110" in binary numbers notation stored in the secondary associative memory words 9-4 and 9-5 are completely coincident with the state of the secondary bit lines 20-1 through 20-4. The secondary match lines 21-4 and 21-5 are therefore put into a valid state "1", and the remaining secondary match lines 21-1, 21-2, and 21-3 are put into an invalid state "0".

Since the primary match line 13-1 is put into a valid state "1" on completion of the secondary searching operation, the invalidation means 22-1 delivers a state "0" of the secondary match line 21-1 to the match line 11-1. Since the primary match line 13-2 is put into an invalid state "0", the invalidation means 22-2 delivers an invalid state "0" to the match line 11-2. Since the primary match line 13-3 is put into an invalid state "0", the invalidation means 22-3 delivers an invalid state "0" to the match line 11-3. Since the primary match line 13-4 is put into an invalid state "0", the invalidation means 22-4 delivers an invalid state "0" to the match line 11-4. Since the primary match line 13-5 is put into a valid state "1", the invalidation means 22-5 delivers a state "1" of the secondary match line 21-5 to the match line 11-5. Only the match line 11-5 is therefore put into a valid state "1" upon completion of the secondary searching operation, and the remaining match lines 11-1, 11-2, 11-3, and 11-4 are put into an invalid state "0". It will therefore be understood that, in the match lines 11-1 through 11-5 corresponding to one of the storage data coincident with the search data 10 taking the mask information into account, the associative memory 23 of the second embodiment according to the present invention puts the only match line 11-5 corresponding to the storage data with the least number of bits in a mask valid state for the mask information into a valid state in the matter similar to the above-mentioned conventional associative memory 100.

The reduction effect of the circuit area and power consumption in the associative memory 23 of the second embodiment of the present invention is similar to that of the associative memory 1 of the first embodiment. The counting means 25 of this embodiment simply counts the number of lines to which an invalid state for intermediate data is supplied among the counting input lines 16-1 through 16-$n$, so that when a normalized physical value, for example charge, current, quantity of light, or the like is supplied to the counting means 25 from the counting input lines 16-1 through 16-$n$, it is possible to count it with ease.

As readily understood, since the lines, n in number of the counting input lines 16-1 through 16-$n$ are fixed, the counting means 25 counts the number of lines to which a valid state for the intermediate data is supplied, among the counting input lines 16-1 through 16-$n$, and may store as the secondary storage data a total number of bits with a valid state for the storage data in the secondary associative memory word 9 among the n-bit storage data stored in the corresponding primary associative memory word 7.

In the meanwhile, in the matter similar to discussion of the associative memory 1 of the first embodiment, when all bits of the n-bit intermediate data 15 in FIG. 3 are not simultaneously put into an invalid state, namely, when the associative memory 4 for primary searching operation does not store such structured data that all bits of the mask information are put into mask valid state, it is obvious that the lines, p in number of the counting output lines 26-1 through 26-$p$ can also be obtained by the above-mentioned Equation 5, and it is possible to further reduce the whole circuit area and power consumption of the associative memory 23.

As a matter of course, a method for the counting means 25 to code the counting result into the secondary search data 19 is arbitrary without being limited to coding it into the binary numbers. The bit width p of the secondary search data 19 in that case is determined not by Equations 1 and 5 but by the coding method.

Third Embodiment

Figure 5:
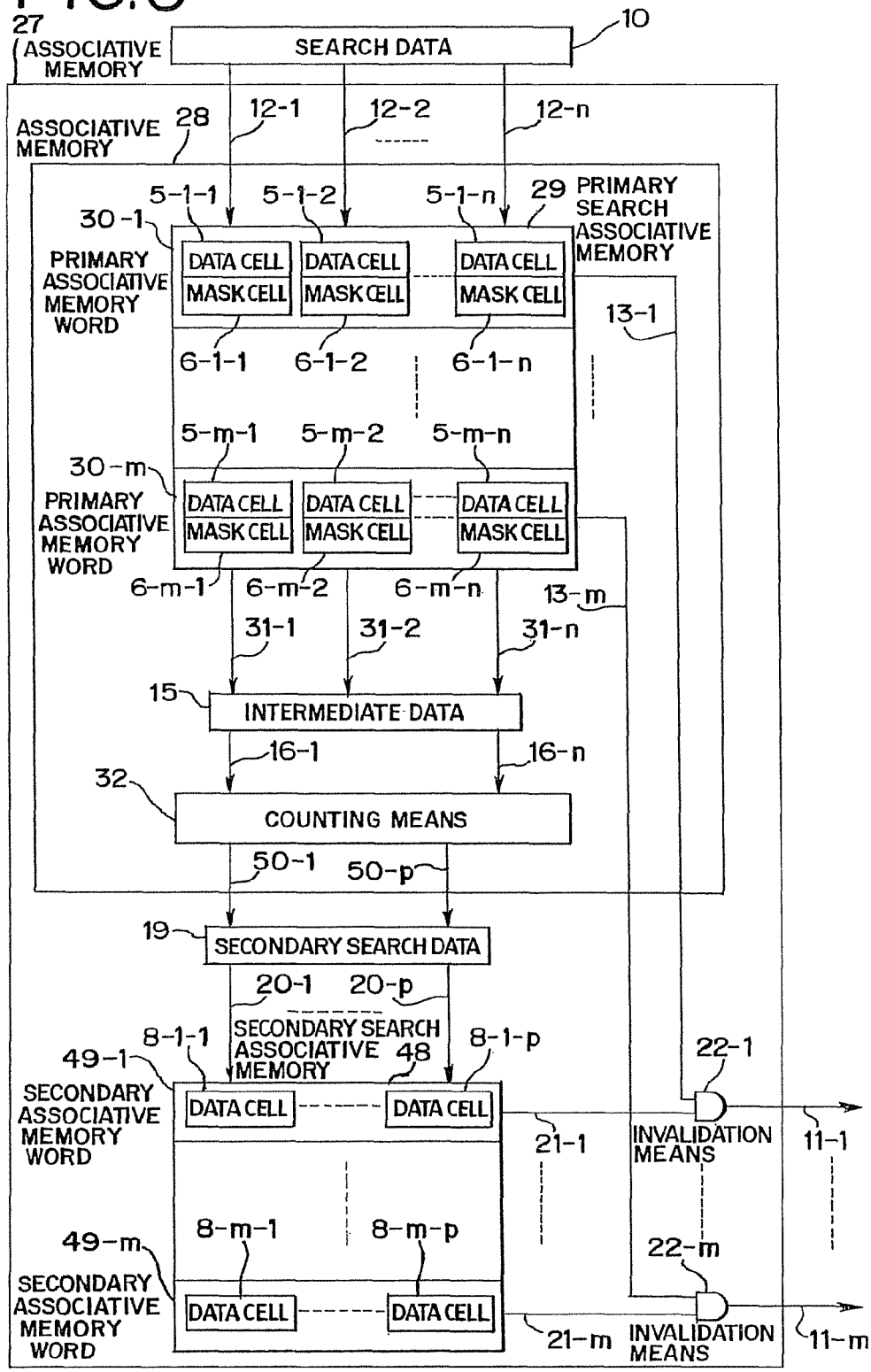
FIG. 5 is a block diagram of an associative memory according to a third embodiment of the present invention.

Next referring to FIG. 5, description will be made about an associative memory according to a third embodiment of the present invention. FIG. 5 is a block diagram of an associative memory 27 according to a third embodiment of the present invention. The associative memory 27 of a first through m-th words n-bit configuration (m and n are an integer variables) comprises an associative memory 28 for primary searching operation of a first through m-th words n-bit configuration, an associative memory 48 for secondary searching operation of a first through m-th words p-bit configuration (p is an integer variable between 1 and n, both inclusive), and the invalidation means 22-1 through 22-$m$, m in number, and has the primary bit lines 12-1 through 12-$n$ for supplying the n-bit search data 10, and the match lines 11-1 through 11-$m$, m in number for delivering a final result of the searching operation. The associative memory 28 of a first through m-th words n-bit configuration comprises an associative memory 29 for primary searching operation of a first through m-th words n-bit configuration, and counting means 32, and is supplied with the primary bit lines 12-1 through 12-$n$, and delivers the primary match lines 13-1 through 13-$m$ and counting output lines 50-1 through 50-$p$.

The associative memory 1 of the first embodiment shown in FIG. 1 is the embodiment comprising the associative memory 4 for primary searching operation for producing the intermediate data 15 by a logical sum operation, with a valid state for the storage data as true, of all coincident storage data as a result of the primary searching operation for searching one of the storage data coincident with the searching data taking the mask information into account, and the associative memory 27 of the third embodiment shown in FIG. 5 is the embodiment comprising the associative memory 29 for primary searching operation for producing the intermediate data 15 by a logical product operation (AND operation), with a valid state for the mask information as true, of all mask information corresponding to the coincident storage data as a result of the primary searching operation for searching one of the storage data coincident with the searching data taking the mask information into account.

The associative memory 29 for primary searching operation comprises each of n-bit primary associative memory words 30-1 through 30-m capable of storing structured data comprising storage data and mask information and is supplied with the primary bit lines 12-1 through 12-n, and delivers the primary match lines 13-1 through 13-m and intermediate data lines 31-1 through 31-n. The primary associative memory words 30-j (j is an integer variable between 1 and m, both inclusive) comprise data cells 5-j-1 through 5-j-n for storing the n-bit storage data and mask cells 6-j-1 through 6-j-n for storing the corresponding n-bit mask information. Herein, when a bit of the structured data is represented by the symbol "*" as "don' care", the corresponding bit of the mask information is stored in the corresponding mask cell 6 with a valid state for the mask information. The associative memory 29 for primary searching operation carries out a primary searching operation to search the storage data coincident with the primary bit lines 12-1 through 12-n taking the corresponding mask information into account, and puts the primary match line 13 corresponding to the primary associative memory word 30 which stores the coincident storage data into a valid state, and puts other primary match lines 13 into an invalid state. The associative memory 29 for primary searching operation also supplies a value obtained from a result of a logical product operation (AND operation), with a valid state for the mask information as true, of all mask information corresponding to coincident storage data to the intermediate data lines 31-1 through 31-n as the n-bit intermediate data 15. A state of the n-bit intermediate data 15 is supplied to counting input lines 16-1 through 16-n, n in number.

The counting means 32 is supplied with the counting input lines 16-1 through 16-n, n in number and delivers counting output lines 50-1 through 50-p, p in number. The counting means 32 counts the number of bits of an invalid state for the intermediate data lasting from a bit location of the intermediate data 15 corresponding to the lowest hierarchy to the higher hierarchy of the network address until a first bit of an invalid state for the intermediate data appears, and delivers the counting result to the counting output lines 50-1 through 50-p as p-bit secondary search data 19. The p-bit secondary search data 19 is supplied to p-bit secondary bit lines 20-1 through 20-p, p in number.

In this case, the minimum value of the counting result is 0 in decimal numbers and the maximum value thereof is n in decimal numbers. The lines, p in number of the counting output lines 50-1 through 50-p therefore become an integer variable to satisfy above-mentioned Equation 1 when the counting result is coded into binary numbers.

The associative memory 48 for secondary searching operation of a first through m-th words p-bit configuration is supplied with the secondary bit lines 20-1 through 20-p, and produces the secondary match lines 21-1 through 21-m. The associative memory 48 for secondary searching operation comprises the secondary associative memory words 49-1 through 49-m which can store the p-bit secondary storage data. The j-th secondary associative memory word 49-j comprises the data cells 8-j-1 through 8-j-p for storing the p-bit secondary storage data.

The associative memory 48 for secondary searching operation carries out a secondary searching operation to search secondary storage data coincident with the secondary bit lines 20-1 through 20-p, and put a secondary match line 21 corresponding to the secondary associative memory word 49 which stores the coincident secondary storage data into a valid state, and puts other secondary match lines 21 into an invalid state. As is understood from the drawing, the associative memory 48 for secondary searching operation of a first through m-th words p-bit configuration in the third embodiment can completely be configured similar to the associative memory 3 for secondary searching operation of a first through m-th words p-bit configuration of the first embodiment referring to FIG. 1.

The secondary associative memory words 49-1 through 49-m, m in number correspond one-to-one to the primary associative memory words 30-1 through 30-m, m in number. Although corresponding ways are arbitrary, the j-th secondary associative memory word 49-j corresponds to the j-th primary associative memory word 30-j in this embodiment. Only a point that the data cells 8-j-1 through 8-j-p of the j-th secondary associative memory word 49-j store as the p-bit secondary storage data a p-bit operation result obtained from a result for the counting means 32 to carry out the same operation to n-bit storage data stored in the corresponding primary associative memory word 30-j as the counting means 32 carries out to the n-bit counting input lines 16-1 through 16-n is different from the associative memory 3 for secondary searching operation of the associative memory 1 of the first embodiment.

Figure 6:
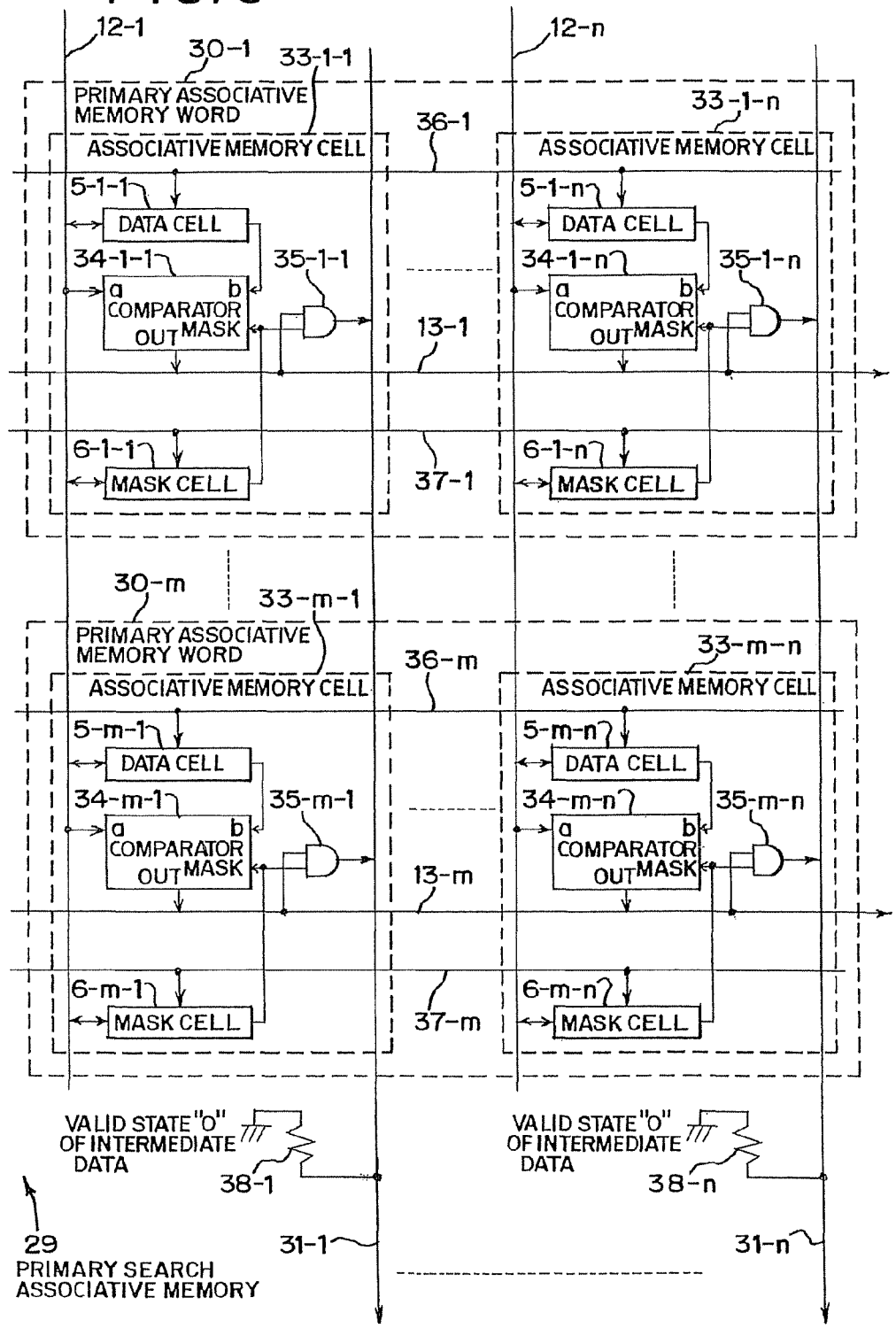
FIG. 6 is a block diagram of a primary associative memory in FIG. 5.

The j-th invalidation means 22-j is supplied with the secondary match line 21-j which the secondary associative memory word 49-j produces, and the primary match line 13-j which the primary associative memory word 30-j corresponding to the secondary associative memory word 49-j produces. The invalidation means 22-j puts the match line 11-j into an invalid state for the match line when the primary match line 13-j is an invalid state for the primary match line, and puts the match line 11-j into a state of the secondary match line 21-j when the primary match line 13-j is a valid state for the primary match line. The invalidation means 22-j comprises logical product operational circuits with a valid state for the primary match line and a valid state for the secondary match line as true in FIG. 5, as readily understood, it can comprises a wired logical circuit or the like Referring to FIG. 6, the associative memory 29 for primary searching operation of a first through m-th words n-bit configuration of the associative memory 27 of a first through m-th words n-bit configuration in third embodiment will be described. The associative memory 29 for primary searching operation of a first through m-th words n-bit configuration comprises the n-bit primary associative memory words 30-1 through 30-m, and resisters 38-1 through 38-n. The j-th (where j is an integer variable between 1 and m, both inclusive) primary associative memory word 30-j comprises first through n-th associative memory cells 33-j-1 through 33-j-n. The j-th primary associative memory word 30-j connected to corresponding data word line 36-j and mask word line 37-j as input lines, to the corresponding primary match line 13-j and the intermediate data lines 31-1 through 31-n as output lines, and to the primary bit lines 12-1 through 12-n, n in number as data input/output lines.

The k-th bit associative memory cell 33-j-k (where k is an integer variable between 1 and n, both inclusive) of the j-th primary associative memory word 30-$j$ is connected to the corresponding data word line 36-$j$ and the mask word line 37-$j$ as input lines, to the corresponding primary match line 13-$j$ and the intermediate data line 31-$k$ as the output lines, and to the primary bit line 12-$k$ as data input/output lines.

The associative memory cell 33-$j$-$k$ comprises a data cell 5-$j$-$k$, a comparator 34-$j$-$k$, a mask cell 6-$j$-$k$, and a logical gate 35-$j$-$k$. The data cell 5-$j$-$k$ is for storing "data" bit information at a corresponding bit of the storage data supplied from an external source through the primary bit line 12-$k$. The comparator 34-$j$-$k$ is for comparing the "data" bit information stored in the data cell 5-$j$-$k$ and "search" bit information at a corresponding bit of search data supplied from the external source through the primary bit line 12-$k$. The mask cell 6-$j$-$k$ is for storing "mask" bit information of a corresponding bit of mask information supplied from the external source through the primary bit line 12-$k$.

In this embodiment, a valid state and an invalid state for the mask information are represented by "0" and "1", respectively and a valid state and an invalid state for storage data are represented by "1" and "0", respectively. In the matter similar to the mask information, a valid state and an invalid state are represented by "1" and "0", respectively, for the intermediate data lines 31-1 through 31-$n$. A valid state and an invalid state are represented by "1" and "0", respectively, for the primary match lines 13-1 through 13-$m$, the secondary match lines 21-1 through 21-$m$, and the match lines 11-1 through 11-$m$.

The data cell 5-$j$-$k$ stores as the storage data the state on a corresponding primary bit line 12-$k$ on which the write data is driven when a corresponding data word line 36-$j$ is in valid state, or supplies the storage data stored therein to the corresponding primary bit line 12-$k$ on which the write data is not driven when a corresponding data word line 36-$j$ is in a valid state. When the corresponding data word line 36-$j$ is in an invalid state, no operation is performed for the corresponding primary bit line 12-$k$. Irrespective of the state of the corresponding data word line 36-$j$, the storage data stored therein is supplied to the comparator 34-$j$-$k$ in the same associative memory cell 33-$j$-$k$.

The mask cell 6-$j$-$k$ stores as the mask information the state on a corresponding primary bit line 12-$k$ on which the write data is driven when a corresponding mask word line 37-$j$ is in a valid state, or supplies the mask information stored therein to the corresponding primary bit line 12-$k$ on which the write data is not driven when a corresponding mask word line 37-$j$ is in a valid state. When the corresponding mask word line 37-$j$ is in an invalid state, no operation is performed for the corresponding primary bit line 12-$k$. Irrespective of the state of the corresponding mask word line 37-$j$, the mask information stored therein is supplied to the comparator 34-$j$-$k$ in the same associative memory cell 33-$j$-$k$ and the logical gate 35-$j$-$k$.

Prior to the primary searching operation, the primary match lines 13-1 through 13-$m$ are precharged to a high level to be put into a valid state "1".

The comparator 34-$j$-$k$ is supplied with the corresponding primary bit line 12-$k$, the storage data stored in the data cell 5-$j$-$k$, and the mask information stored in mask cell 6-$j$-$k$, in the same associative memory cell 33-$j$-$k$. When the mask information is in a valid state "0" or when the value on the corresponding primary bit line 12-$k$ and the storage data in the data cell 5-$j$ are coincident with each other, the corresponding primary match line 13-$j$ is put into an opened state. Otherwise, the comparator 34-$j$-$k$ puts the primary match line 13-$j$ into an invalid state "0". The wired AND logic connection with the valid state "1" for the primary match line 13 as true is achieved such that, when all the comparators 34-$j$-1 through 34-$j$-$n$, n in number, in the j-th primary associative memory word 30-$j$ render the primary match line 13-$j$ in an opened state, the primary match line 13-$j$ is put into a valid state "1", and otherwise into an invalid state "0". In other words, upon the primary searching operation, only when all of the storage data stored in a primary associative memory word 30-$j$ is completely coincident with the value of the primary bit lines 12-1 through 12-$n$ except those bits excluded from a comparison object by the mask valid state "0" in the corresponding mask information, the primary match line 13-$j$ is put into a valid state "1", and otherwise into an invalid state "0".

The logical gate 35-$j$-$k$ supplies an invalid state "1" for the intermediate data line 31 to the corresponding intermediate data line 31-$k$ when the primary match line 13-$j$ in the same primary associative memory word 30-$j$ is in a valid state "1" and the mask information stored in the corresponding mask cell 6-$j$-$k$ in the same associative memory cell 33-$j$-$k$ is in an invalid state "1" for the mask information. Otherwise, the logical gate 35-$j$-$k$ puts the intermediate data line 31-$k$ into an opened state. The intermediate data line 31-$k$ is connected to a valid state "0" for the intermediate data line 31 through a resister 38-$k$, and is also connected to all of the corresponding logical gates 35-1-$k$ through 35-$m$-$k$, m in number, by a wired AND connection with a valid state "0" for the intermediate data line 31 as true. Specifically, the intermediate data line 31-$k$ is supplied with the result of a logical product (logical AND), with a valid state "0" for the mask information as true, of all the mask information stored in the corresponding mask cells 6-1-$k$ through 6-$m$-$k$ in all of the k-th bit associative memory cells 33-1-$k$ through 33-$m$-$k$ which have the primary match line 13-1 through 13-$m$ that are in a valid state "1" upon completion of the primary searching operation by the logical gates 35-1-$k$ through 35-$m$-$k$, m in number and the resister 38-$k$. As mentioned above, upon completion of the primary searching operation, the intermediate data lines 31-1 through 31-$n$ are supplied with the same value of the mask information corresponding to the storage data coincident with the search data 10 that has the least number of bits in a valid state "0" for the mask information.

(Operation of the Third Embodiment)

Next, referring to FIG. 7, description will be made about the operation when the above-mentioned associative memory 27 of the third embodiment according to the present invention is used in calculating the transfer network address in the network device 400-1 in FIG. 11. In the matter similar to the discussion of the operation of the associative memory 1 of the first embodiment in FIG. 2, the associative memory 27 therefore comprises a first through fifth words nine-bit configuration in FIG. 7. Since the bit width n of the search data 10 is nine bits, the associative memory 29 for primary searching operation in the associative memory 28 comprises a first through fifth words nine-bit configuration. Since the bit width n of the search data 10 is nine bits, the bit width p of the secondary search data 19 comprises four bits from Equation 1, and the associative memory 48 for secondary searching operation comprises a first through fifth words four-bit configuration.

In this embodiment, a valid state and an invalid state for the mask information are represented by "0" and "1", respectively and a valid state and an invalid state for storage data are represented by "1" and "0", respectively. In the matter similar to the mask information, a valid state and an invalid state are represented by "1" and "0", respectively, for the intermediate data lines 31-1 through 31-9. A valid state and an invalid state are represented by "1" and "0", respectively for the primary match lines 13-1 through 13-5, the secondary match lines 21-1 through 21-5, and the match lines 11-1 through 11-5.

In the matter similar to the discussion of the operation of the associative memory 1 in the first embodiment in FIG. 2, the associative memory 27 memorizes the connection information of the network device 400-1 in FIG. 11 in each of the nine-bit primary associative memory words 30-1 through 30-5 as the storage data and the mask information. Herein, when a digit of a network address is represented by the symbol "*" as "don't care", the corresponding bit of the mask information is stored with a valid state "0" for the mask information. When a digit of a network address is represented by the symbol "*" as "don't care", although the corresponding bit of the storage data is arbitrary, an invalid state "0" for the storage data is stored therein for discussion. Thereby, the storage data and the mask information stored in the primary associative memory words 30-1 through 30-5 in FIG. 7 become the same as the storage data and the mask information stored in the primary associative memory words 7-1 through 7-5 in FIG. 2, respectively.

Further, each of the four-bit secondary associative memory words 49-1 through 49-5 stores as the secondary storage data a result obtained from a result for the counting means to count the number of bits with a valid state "0" for the mask information lasting from a bit location corresponding to the lowest hierarchy to the higher hierarchy of the network address among the nine-bit mask information stored in the corresponding primary associative memory words 30-1 through 30-5 until a bit of an invalid state "1" for the first mask information appears similar to the operation that the counting means 32 carries out to the nine-bit counting input lines 16-1 through 16-9, respectively. Accordingly, since the primary associative memory word 30-1 stores the mask information "111.000.000", the secondary associative memory word 49-1 stores 6 in decimal numbers notation, "0110" in binary numbers notation as the secondary storage data. Since the primary associative memory word 30-2 stores the mask information "111.000.000", the secondary associative memory word 49-2 stores 6 in decimal numbers notation, "0110" in binary numbers notation as the secondary storage data. Since the primary associative memory word 30-3 stores the mask information "111.111.000", the secondary associative memory word 49-3 stores 3 in decimal numbers notation, "0011" in binary numbers notation as the secondary storage data. Since the primary associative memory word 30-4 stores the mask information "111.111.000", the secondary associative memory word 49-4 stores 3 in decimal numbers notation, "0011" in binary numbers notation as the secondary storage data. Since the primary associative memory word 30-5 stores the mask information "111.111.000", the secondary associative memory word 49-5 stores 3 in decimal numbers notation, "0011" in binary numbers notation as the secondary storage data.

Prior to the primary searching operation, all of the primary match lines 13-1 through 13-5 are precharged to a high level to be put into a valid state "1". Prior to the secondary searching operation, all of the secondary match lines 21-1 through 21-5 are also precharged to a high level to be put into a valid state "1".

Description will proceed to the searching operation by supplying as the search data 10 the network address (2.6.5), in octal numbers notation, of the user's terminal 401-3 in FIG. 11.

The value "010.110.101" in binary numbers notation of nine bits of the search data 10 is supplied to the nine primary bit lines 12-1 through 12-9, and the associative memory 29 for primary searching operation in the associative memory 28 carries out the primary searching operation. As a result, (2.*.*) in octal numbers notation stored in the primary associative memory word 30-1 and (2.6.*) in octal numbers notation stored in the primary associative memory word 30-5 are coincident with the search data on the primary bit lines 12-1 through 12-9. Accordingly, as a result of the primary searching operation, two primary match lines 13-1 and 13-5 are put into a valid state "1", and the remaining primary match lines 13-2, 13-3, and 13-4 are put into an invalid state "0".

Herein, the intermediate data line 31-1 produces the logical product "1", with "0" as true, of the mask information "1", and "1" in the primary associative memory words 30-1 and 30-5 at bit positions corresponding to the intermediate data line 31-1. The intermediate data line 31-2 produces the logical product "1", with "0" as true, of the mask information "1", and "1" in the primary associative memory words 30-1 and 30-5 at bit positions corresponding to the intermediate data line 31-2. Likewise; the intermediate data lines 31-3, 31-4, 31-5, 31-6, 31-7, 31-8, and 31-9 produce logical product "1" of "1" and "1", logical product "1" of "0" and "1", logical product "1" of "0" and "1", logical product "1" of "0" and "1", logical product "0" of "0" and "0", logical product "0" of "0" and "0", and logical product "0" of "0" and "0", respectively, with "0" as true. Therefore, the intermediate data 15 of nine bits results in "111111000" in binary numbers notation, which is supplied to the counting input lines 16-1 through 16-9.

The counting means 32 produces 3 in decimal numbers notation, "0011" in binary numbers notation obtained from a result of counting the number of bits with a valid state "0" for the mask information lasting from a bit location 16-9 corresponding to the lowest hierarchy to the higher hierarchy of the network address among the states of the nine counting input lines 16-1 through 16-9 until a bit in an invalid state "1" for the first mask information appears to the counting output lines 50-1 through 50-4. The state of the counting output lines 50-1 through 50-4 is supplied to the secondary bit lines 20-1 through 20-4 as the four-bit secondary search data 19.

When the secondary search data 19 is supplied to the secondary bit lines 20-1 through 20-4, the associative memory 48 for secondary searching operation carries out a secondary searching operation. As a result, "0110" in binary numbers notation stored in the secondary associative memory words 49-3, 49-4, and 49-5 are completely coincident with the state of the secondary bit lines 20-1 through 20-4. The secondary match lines 21-3, 21-4, and 21-5 are therefore put into a valid state "1", and the remaining secondary match lines 21-1 and 21-2 are put into an invalid state "0".

Since the primary match line 13-1 is put into a valid state "1" on completion of the secondary searching operation, the invalidation means 22-1 delivers a state "0" of the secondary match line 21-1 to the match line 11-1. Since the primary match line 13-2 is put into an invalid state "0", the invalidation means 22-2 delivers an invalid state "0" to the match line 11-2. Since the primary match line 13-3 is put into an invalid state "0", the invalidation means 22-3 delivers an invalid state "0" to the match line 11-3. Since the primary match line 13-4 is put into an invalid state "0", the invalidation means 22-4 delivers an invalid state "0" to the match line 11-4. Since the primary match line 13-5 is put into a valid state "1", the invalidation means 22-5 delivers a state "1" of the secondary match line 21-5 to the match line 11-5. Only the match line 11-5 is therefore put into a valid state "1" upon completion of the secondary searching operation, and the remaining match lines 11-1, 11-2, 11-3, and 114 are put into an invalid state "0". It will therefore be understood that, in the match lines 11-1 through 11-5 corresponding to one of the storage data coincident with the search data 10 taking the mask information into account, the associative memory 27 of the third embodiment according to the present invention puts the only match line 11-5 corresponding to the storage data with the least number of bits in a mask valid state for the mask information into a valid state similar to the above-mentioned conventional associative memory 100.

The reduction effect of the circuit area and power consumption in the associative memory 27 of the third embodiment of the present invention is similar to that of the associative memory 1 of the first embodiment.

As readily understood, the counting means 32 of this embodiment may simply count the number of lines to which a valid state for the intermediate data is supplied, among the counting input lines 16-1 through 16-n similar to the counting means 25 of the associative memory 23 of the second embodiment. Similarly, as readily understood, since the counting input lines 16-1 through 16-n, n in number are fixed, the counting means 32 may count the number of lines to which an invalid state for the intermediate data is supplied, among the counting input lines 16-1 through 16-n, either. It cannot be overemphasized that the counting means 32 may count the number of bits in an invalid state for the mask information lasting from a bit location corresponding to the highest hierarchy to the lower hierarchy of the network address of the intermediate data 15 until a bit in a valid state for the first mask information appears, either. As a matter of course, irrespective of the operation method of the counting means 32, the secondary associative memory word 49 stores as the secondary storage data a value obtained from a result for the counting means 25 to carry out the same operation as it carries out to the n-bit mask information stored in the corresponding primary associative memory word 30.

In the meanwhile, in the matter similar to the discussion of the associative memory 1 of the first embodiment, when all bits of the n-bit intermediate data 15 in FIG. 5 are not simultaneously put into a valid state, namely, when the associative memory 29 for primary searching operation does not store such structured data that all bits of the mask information are put into mask valid state, it is obvious the lines, p in number of the counting output lines 50-1 through 50-p can also be obtained by the above-mentioned Equation 5, and it is possible to further reduce the whole circuit area and power consumption of the associative memory 27.

As a matter of course, a method for the counting means 32 to code the counting result into the secondary search data 19 is arbitrary without being limited to coding it into the binary numbers. The bit width p of the secondary search data 19 in that case is determined not by Equations 1 and 5 but by the coding method.

Figure 7:
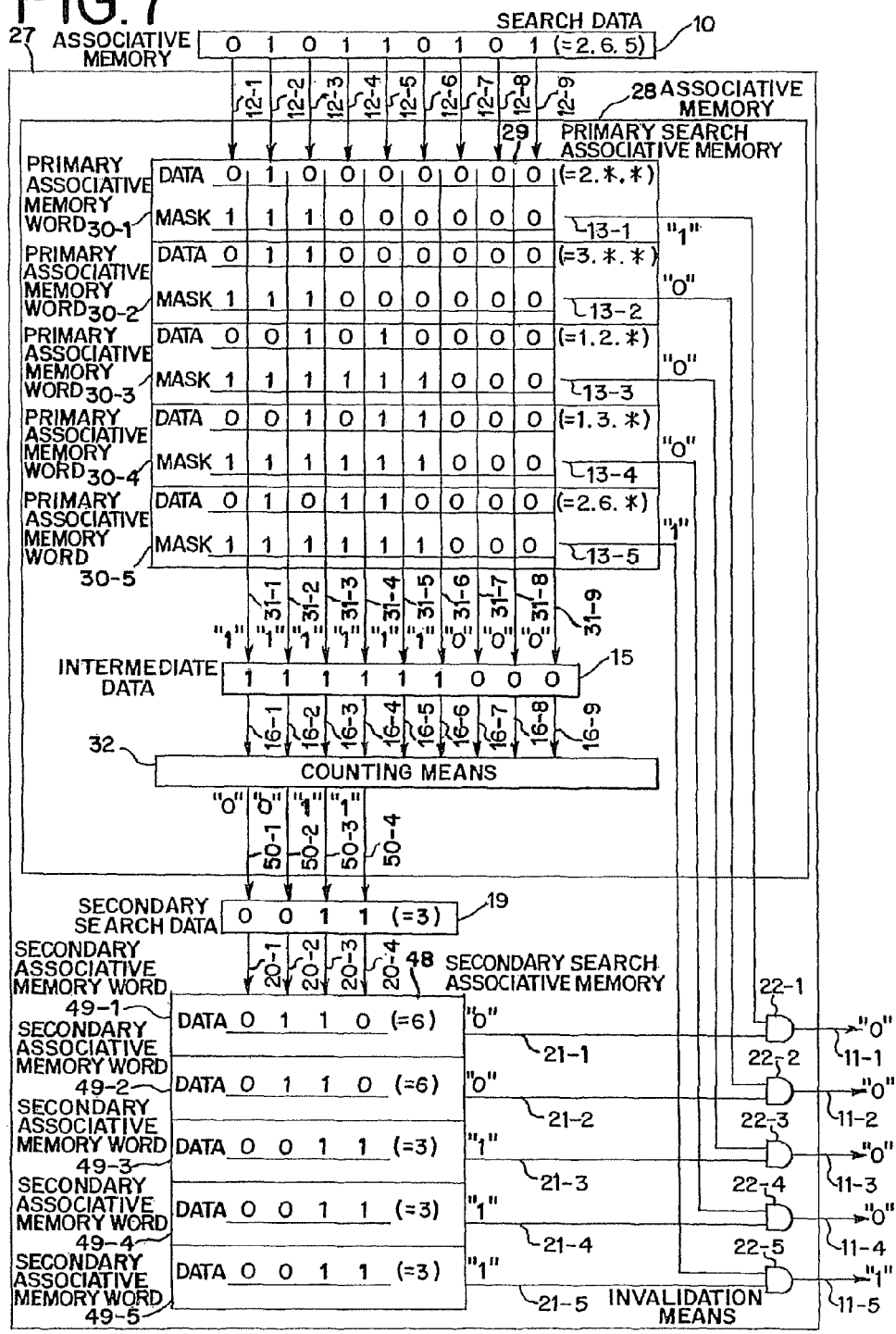

In the meanwhile, as is understood when comparing FIG. 7 with FIG. 2, a logical product operation of the intermediate data lines 31-1 through 31-n which the associative memory 29 for primary searching operation of this embodiment produces, and are obtained by carrying out a logical product, with a valid state for the mask as true, of all the mask information corresponding to the storage data coincident with the result of the primary searching operation, and the search data 10 with a valid state for the storage data as true is carried out, so that the same value as that of the intermediate data lines 14-1 through 14-n supplied by the associative memory 4 for primary searching operation of the first embodiment can be obtained. Therefore, it cannot be overemphasized that the associative memory 4 for primary searching operation of the first embodiment can be substituted for the configuration mentioned-above.

Fourth Embodiment

Figure 8:
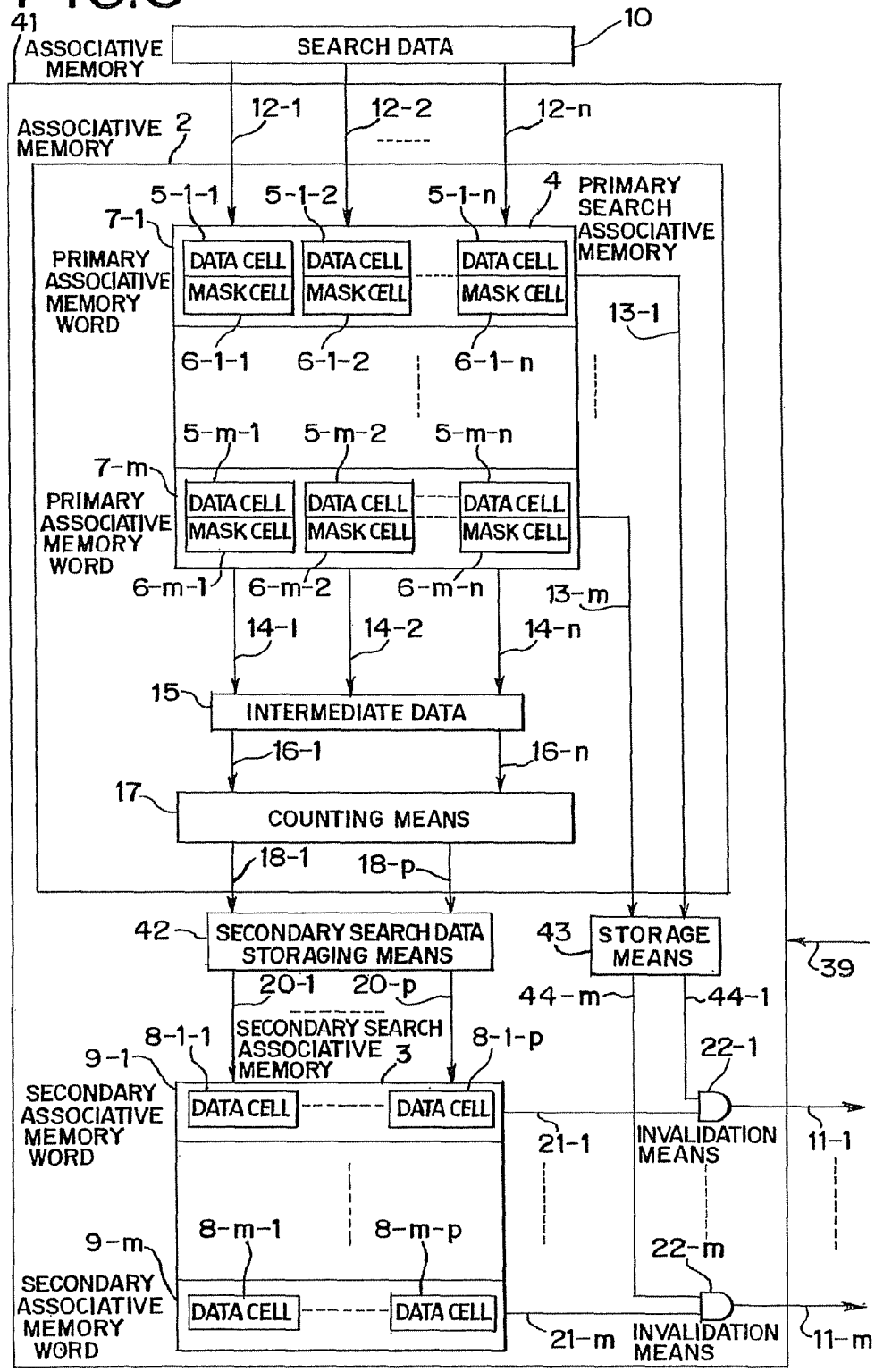
FIG. 8 is a block diagram of an associative memory according to a fourth embodiment of the present invention.

Next referring to FIG. 8, description will be made about an associative memory 41 according to a fourth embodiment of the present invention. FIG. 8 is a block diagram showing an associative memory 41 of a first through m-th words n-bit configuration (m and n are integer variables) in the fourth embodiment of the present invention. The components of the first through m-th words n-bit associative memory 41 of this embodiment are similar to those of the first through m-th words n-bit associative memory 1 of the first embodiment, except adding a clock signal 39 as an input signal from the external source, changing the secondary search data 19 to be stored in the secondary search data memory means 42, inserting m-bit storage means 43 in the primary match lines 13-1 through 13-m, and changing one input signal supplied to the j-th invalidation means 22-j (j is an integer variable between 1 and m, both inclusive) to a synchronization primary match line 44-j supplied by the storage means 43 from the primary match line 13-j. Therefore, description will be directed only to those components different from the associative memory 1 of the first embodiment.

In this embodiment, the secondary search data storage means 42 stores counting output lines 18-1 through 18-p (p is an integer variable between 1 and n, both inclusive), p in number produced by the first through m-th words n-bit associative memory 2 in synchronization with the clock signal 39. The secondary search data storage means 42 supplies the stored p-bit state to the corresponding secondary bit lines 20-1 through 20-p, p in number.

The m-bit storage means 43 is supplied with the primary match lines 13-1 through 13-m, and produces the synchronization primary match lines 44-1 through 44-m. The synchronization primary match lines 44-1 through 44-m are supplied to the corresponding invalidation means 22-1 through 22-m, respectively. The m-bit storage means 43 stores the primary match lines 13-1 through 13-m produced as a result for the associative memory 4 for primary searching operation to carry out a primary searching operation to the search data 10 in synchronization with the clock signal. The storage means 43 supplies said stored state of the primary match lines 13-1 through 13-m to the synchronization primary match lines 44-1 through 44-m so as to synchronize the timing when a result for the associative memory 3 for secondary searching operation to carry out the secondary searching operation corresponding to this search data 10 is supplied to the secondary match lines 21-1 through 21-m.

The secondary associative memory words 9-1 through 9-m, m in number correspond one-to-one to the primary associative memory words 7-1 through 7-m, m in number. Although corresponding ways are arbitrary, the j-th secondary associative memory word 9-j corresponds to the j-th primary associative memory word 7-3 in this embodiment.

The j-th invalidation means 22-j is supplied with the secondary match line 21-j which the secondary associative memory word 9-j produces, and the synchronization primary match line 44-j with which the primary match line 13-j supplied with the primary associative memory word 7-j corresponding to the secondary associative memory word 9-j is synchronized by the storage means 43. The invalidation means 22-j puts the match line 11-j into an invalid state for the match line when the synchronization primary match line 44-j is an invalid state for the primary match line, and puts the match line 11-j into a state of the secondary match line 21-j when the synchronization primary match line 44-j is a valid state for the primary match line.

Although the primary searching operation and the secondary searching operation to the same search data 10 are sequentially carried out in the associative memory 1 of the first embodiment, the associative memory 23 of the second embodiment, and the associative memory 27 of the third embodiment, means of individually storing the primary match lines 13-1 through 13-*m* and the counting output lines 18-1 through 18-*p* supplied by the associative memory 4 for primary searching operation are provided, so that it is possible to realize pipeline processing by the associative memory 4 for primary searching operation and the associative memory 3 for secondary searching operation in this embodiment. Thereby, it becomes possible to make frequency of the clock signal 39 higher.

Even when the storage means is further inserted in order to make the frequency of the clock signal 39 higher, as readily understood, it can be realized by making the storage means 43 produce the timing of supplying the result of the primary searching operation for the search data 10 to the synchronization primary match lines 44-1 through 44-*m* so as to synchronize with the timing of supplying the result of the secondary searching operation for these search data to the secondary match lines 21-1 through 21-*m*. For example, it goes without saying that the associative memory 2 comprises the storage means of storing the intermediate data 15, so that it is possible to realize pipeline processing of the execution of the primary searching operation by the associative memory 4 for primary searching operation and the operation by the counting means 17.

In the meanwhile, it goes without saying that also in the associative memory 1 of the first embodiment, the associative memory 23 of the second embodiment, and the associative memory 27 of the third embodiment like a configuration to insert the storage means of storing said intermediate data 15, when the timing of supplying the primary searching operation result for the search data 10 to the primary match lines 13-1 through 13-*m* and the timing of supplying the secondary searching operation result for these search data 10 to the secondary match lines 21-1 through 21-*m* are different, the synchronization can be achieved by inserting the storage means 43 in the primary match lines 13-1 through 13-*m*.

Fifth Embodiment

Figure 9:
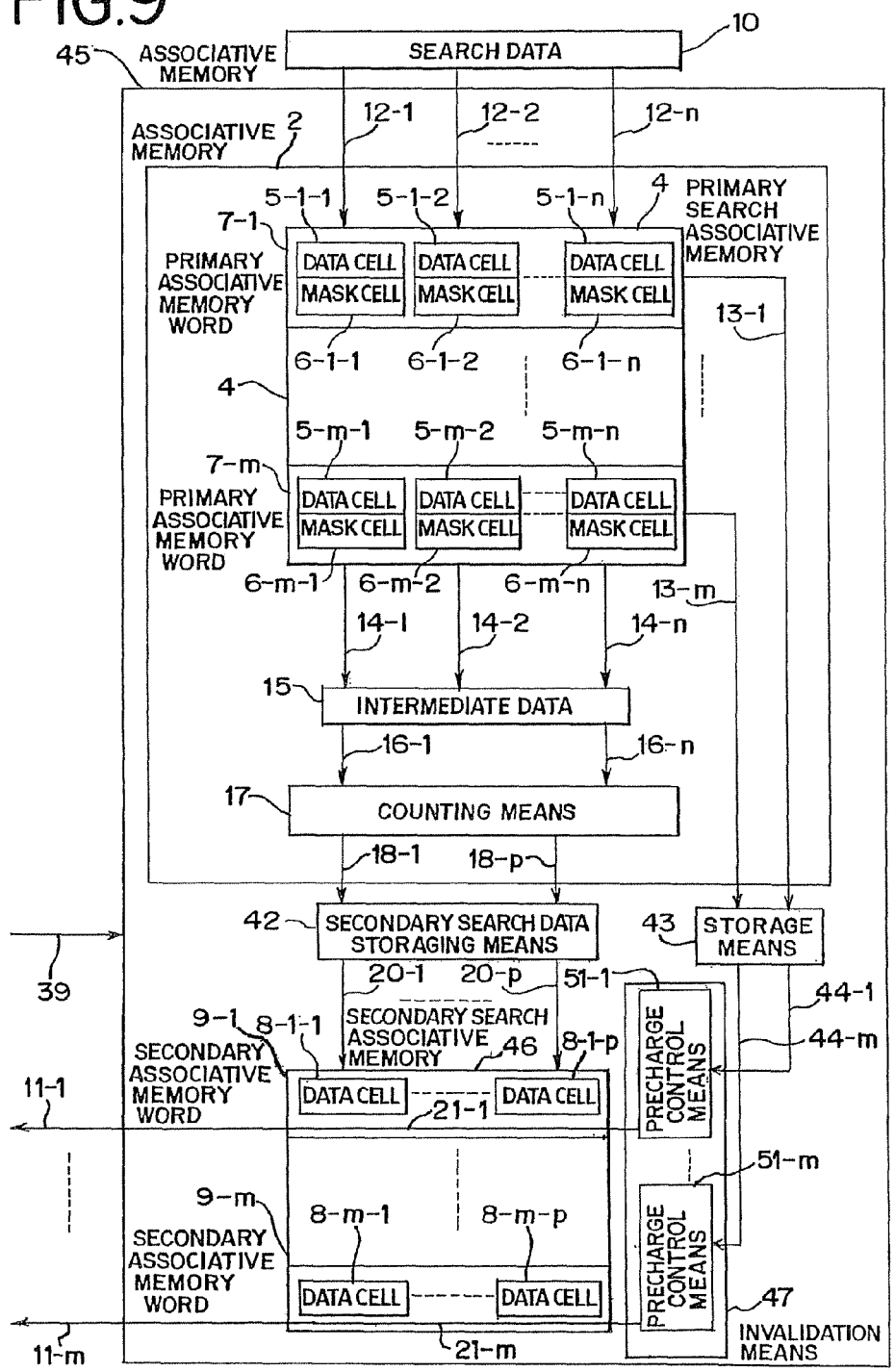
FIG. 9 is a block diagram of an associative memory according to a fifth embodiment of the present invention.

Next referring to FIG. 9, description will be made about an associative memory 45 according to a fifth embodiment of the present invention. FIG. 9 is a block diagram showing an associative memory 45 of a first through m-th words n-bit configuration (in and n are integer variables) in the fifth embodiment of the present invention. Components of the associative memory 45 of a first through m-th words n-bit configuration of this embodiment are similar to those of the associative memory 41 of a first through m-th words n-bit configuration of the fourth embodiment, except changing the associative memory 3 for secondary searching operation of a first through m-th words p-bit configuration (p is an integer variable between 1 and n, both inclusive) to an associative memory 46 for secondary searching operation, changing the invalidation means 22-1 through 22-*m* to an invalidation means 47, changing the invalidation means 47 so as to be supplied with only the synchronization primary match lines 44-1 through 44-*m* and produces the secondary match lines 21-1 through 21-*m*, and changing the associative memory 46 for secondary searching operation so as to supply the secondary match lines 21-1 through 21-*m* after changing the state according to the secondary searching operation result to the external source as the match lines 11-1 through 11-*m*. Therefore, description will be directed only to those components different from the associative memory 41 of the fourth embodiment.

The invalidation means 47 supplied with the secondary search data corresponding to the primary searching operation result on the synchronization primary match lines 44-1 through 44-*m* is supplied with the synchronization primary match lines 41-1 through 44-*m*, produces the secondary match lines 21-1 through 21-*m*, and comprises precharge control means 51-1 through 51-*m*, m in number. The invalidation means 47 of this embodiment is characterized in that the corresponding secondary match lines 21-1 through 21-*m* are precharged to a valid state or discharged to an invalid state according to the primary searching operation result for the search data 10 supplied on the synchronization primary match lines 44-1 through 44-*m* before the associative memory 46 for secondary searching operation carries out the secondary searching operation corresponding to this search data 10. A j-th (j is an integer variable between 1 and m, both inclusive) precharge control means 51-*j* is supplied with the synchronization primary match line 44-*j*, precharges the secondary match line 21-*j* to a valid state for the secondary match line when the synchronization primary match line 44-*j* is in a valid state for the primary match line, and discharges the secondary match line 21-*j* to an invalid state for the secondary match line when the synchronization primary match line 44-*j* is in an invalid state for the primary match line. Specifically, the invalidation means 47 precharges the secondary match line 21-*j* corresponding to the primary associative memory word 7-*j* coincident with the search data 10 after the primary searching operation of the associative memory 4 for primary searching operation thereto to a valid state for the match line, and discharges the secondary match line 21 corresponding to the primary associative memory word 7 incoincident with the search data 10 after the primary searching operation thereto to an invalid state, before the secondary searching operation is carried out. Although corresponding ways between the primary associative memory words 7-1 through 7-*m*, and the secondary match lines 21-1 through 21-*m* are arbitrary, the primary associative memory word 7-*j* corresponds to the secondary match line 21-*j* in this embodiment.

The associative memory 3 for secondary searching operation of the fourth embodiment precharges all the secondary match lines 21-1 through 21-*m* to a valid state for the secondary match line before carrying out the secondary searching operation, and the associative memory 46 for secondary searching operation of the present invention is similar to the associative memory 3 for secondary searching operation of the fourth embodiment, except not precharging the secondary match lines 21-1 through 21-*m* before carrying out the secondary searching operation. In the matter similar to the associative memory 3 for secondary searching operation of the fourth embodiment, as a result for the associative memory 46 for secondary searching operation to carry out the secondary searching operation for the secondary search data stored in the secondary search data storage means 42, when the secondary storage data stored in all of the data cells 8-*j*-1 through 8-*j*-*p* of the secondary associative memory word 9-*j* is coincident with the secondary search data, the secondary associative memory word 9-*j* puts the secondary match line 21-*j* into an opened state, and otherwise, puts the secondary match line 21-*j* into an invalid state for the secondary match line. In this embodiment, a valid state for the secondary match line 21 and a valid state for the match line 11 are the same state, and the state of the secondary match lines 21-1 through 21-*m* is supplied to the external source of the associative memory 45 as the match lines 11-1 through 11-*m*.

Specifically, the match line 11-*j* is put into a valid state for the match line only when the primary associative memory word 7-*j* is coincident with the search data 10 when the associative memory 4 for primary searching operation carries out the primary searching operation, and the secondary associative memory word 9-*j* is coincident with the secondary search data corresponding to this search data 10 when the associative memory 46 for secondary searching operation carries out the secondary searching operation, and otherwise into an invalid state for the match line. It will therefore be understood that the invalidation means 47 functions as the invalidation-means 22 of the fourth embodiment similarly.

In the matter similar to associative memory 41 of the fourth embodiment, the associative memory 45 of the fifth embodiment comprises means of individually storing the primary match lines 13-1 through 13-*m* produced by the associative memory 4 for primary searching operation, and the counting output lines 18-1 through 18-*p*, so that it is possible to realize pipeline processing by the associative memory 4 for primary searching operation and the associative memory 46 for secondary searching operation. Thereby, it becomes possible to make frequency of the clock signal 39 higher.

In the associative memory 45 of the fifth embodiment, the secondary match lines 21-1 through 21-*m*, m in number of the associative memory 46 for secondary searching operation precharges only lines, n in number to a valid state at the maximum, and discharges lines, n in number to an invalid state at the maximum corresponding to the bit length n of the search data 10 every secondary searching operation.

Herein, in the matter similar to the discussion of the first embodiment, when the associative memory 45 comprises the first through 32768th 64-bit associative memory words using 0.25 micron meter rule manufacturing process, and if it is assumed that the supply voltage is 2.5 V and the period of the searching operation is 20 ns, then the maximum total power consumption required for precharge, discharge for every secondary searching operation is 0.0006 W as given by $$(0.3 \text{ pF} \times 7/64 \times 2.5 \text{ V}) \div 20 \text{ ns } 2.5 \text{ V} \times 64 \text{ lines} = 0.0006 \text{ W}.$$

Since the power consumption when the associative memory 4 for primary searching operation carries out the primary searching operation is then 3.07 W similar to that of the first embodiment, the power consumption of the associative memory 46 for secondary searching operation is 0.02% as the power consumption of the whole associative memory 45.

Herein, when making an approximation $(m-n) \approx (m-1)$ similar to Equation 4, if it is assumed that the power consumption of the conventional associative memory 100 is normalized as 1, then the power consumption of the whole chip of associative memory 45 is represented by next Equation 6. Herein, Equation 6 is represented using the above-mentioned Roundup (X) function which rounds up the digits right to the decimal point of the positive real number X into an integer.

$$(1+(\text{Roundup }(\text{Log}_2(n+1))/n) \times n/m)/2 = (1+\text{Roundup }(\text{Log}_2(n+1))/m)/2 \quad \text{Equation 6}$$

From Equation 6, when the bit width n of the search data 10 is 64 bits, and the number of words of the associative memory 41 is 32,768 words, the power consumption of the associative memory 45 is about 50.01% as the power consumption of the conventional associative memory 100, and the power consumption is reducible by about 49.9%. When n>>m, the value given by Equation 6 is about 0.50, and it will be understood that the power consumption of the associative memory 45 of the fifth embodiment becomes about ½ as the power consumption of the conventional associative memory 100.

Sixth Embodiment

Figure 10:
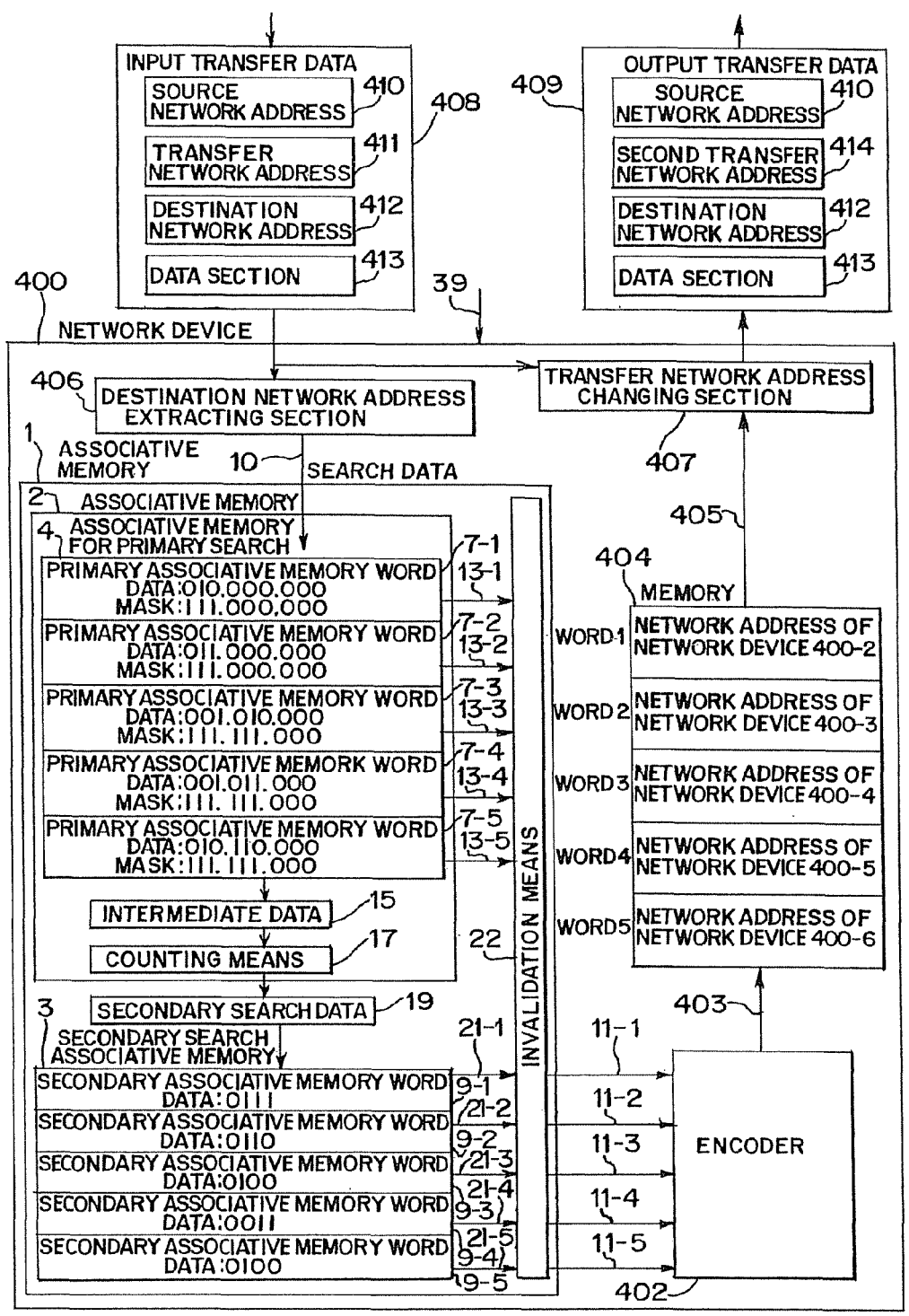
FIG. 10 is a block diagram of a network device of the present invention using the associative memory of the present invention for calculating a transfer network address.

Next referring to FIG. 10, description will be made about the associative memory 1 of the first embodiment of the present invention for used in calculating the transfer network address in the network device of the present invention. The network device 400 of the present invention is supplied with input transfer data 408 and the clock signal 39, and supplies output transfer data 409. The input transfer data 408 comprises a source network address 410, a transfer network address 411, a destination network address 412, and a data section 413. The output transfer data 409 comprises the source network address 410, the second transfer network address 414, the destination network address 412, and the data section 413. Referring to FIG. 10, description will proceed to the network device 400 of the present invention when applied to the network device 400-1 in FIG. 11.

The network device 400 comprises a destination network address extracting section 406, the associative memory 1 of the first embodiment of the present invention, an encoder 402, a memory 404, and a transfer network address changing section 407. The network device 400 operates in synchronization with the clock signal 39.

The destination network address extracting section 406 extracts the destination network address 412 in the input transfer data 408 to supply to the associative memory 1 as the search data 10.

The associative memory 1 of the first embodiment comprises the associative memory 4 for primary searching operation, and the counting means 17, the associative memory 3 for secondary searching operation, and the invalidation means 22 as described above. The associative memory 1 comprises a first through fifth words nine-bit configuration. In the meanwhile, the counting means 17 converts into the four-bit secondary search data 19 the nine-bit intermediate data 15 which the associative memory 4 for primary searching operation supplies (according to Table 1 and Equation 1) to supply to the first through fifth words four-bit associative memory 3 for secondary searching operation. Herein, a valid state and an invalid state are represented by "1" and "0", respectively, for the storage data, and a valid state and an invalid state are represented by "0" and "1", respectively, for the mask information, in FIG. 10.

The associative memory 4 for primary searching operation stores network addresses which show segments, to which network devices 400-2, 400-3, 400-4, 400-5 and 400-6 connected to the network device 400-1 in FIG. 11 belong, in the form of the above-mentioned structured data. Therefore, in the embodiment in FIG. 10, the primary associative memory word 7-1 stores the network address (2.\*.\*) for the segment 2, to which the network device 400-2 belongs, in the form of structured data represented by a pair of the storage data "010.000.000" and the mask information "111.000.000" as mentioned above. Similarly, the primary associative memory word 7-2 stores the network address (3.\*.\*) for the segment 3, to which the network device 400-3 belongs, in the form of structured data represented by a pair of the storage data "011.000.000" and the mask information "111.000.000". The primary associative memory word 7-3 stores the network address (1.2.\*) for the segment 4, to which the network device 400-4 belongs, in the form of structured data represented by a pair of the storage data "001.010.000" and the mask information "111.111.000". The primary associative memory word 7-4 stores the network address (1.3.\*) for the segment 5, to which the network device 400-5 belongs, in the form of structured data represented by a pair of the storage data "001.011.000" and the mask information "111.111.000". The primary associative memory word 7-5 stores the network address (2.6.\*) for the segment 6, to which the network device 400-6 belongs, in the form of structured data represented by a pair of the storage data "010.110.000" and the mask information "111.111.000".

The secondary associative memory word 9-1 stores, as the secondary storage data, 7 in decimal numbers notation, "0111" in binary numbers notation obtained from a result of converting the storage data "010.000.000" stored in the primary associative memory word 7-1 according to Table 1 as described above. The secondary associative memory word 9-2 stores, as the secondary storage data, 6 in decimal numbers notation, "0110" in binary numbers notation obtained from a result of converting the storage data "011.000.000" stored in the primary associative memory word 7-2 according to Table 1. The secondary associative memory word 9-3 stores, as the secondary storage data, 4 in decimal numbers notation, "0100" in binary numbers notation obtained from a result of converting the storage data "001.010.000" stored in the primary associative memory word 7-3 according to Table 1. The secondary associative memory word 9-4 stores, as the secondary storage data, 3 in decimal numbers notation, "0011" in binary numbers notation obtained from a result of converting the storage data "001.011.000" stored in the primary associative memory word 7-4 according to Table 1. The secondary associative memory word 9-5 stores, as the secondary storage data, 4 in decimal numbers notation, "0100" in binary numbers notation obtained from a result of converting the storage data "010.110.000" stored in the primary associative memory word 7-5 according to Table 1.

In the match lines 11-1 through 11-5 corresponding to one of the storage data coincident with the supplied search data 10 taking the mask information into account, the associative memory 1 puts the only match line corresponding to the storage data with the least number of bits in a mask valid state into a valid state.

The encoder 402 codes the match lines 11-1 through 11-5 supplied by the associative memory 1 into a memory address signal 403 to deliver to the memory 404.

The memory 404 stores network addresses of the network devices corresponding to the segment network addresses, each of which comprises the storage data and the mask information and each of which is stored in each of the primary associative memory words 7-1 through 7-5 of the associative memory 1. In the memory 404, each network address of the network device is stored in a word corresponding to the primary associative memory words 7-1 through 7-5 of the associative memory 1 where a corresponding network address is stored. In this embodiment, the same address as the storage address of the associative memory 1 corresponds thereto. For example, the network address (2.*.*) is stored in the primary associative memory word 7-1 of the associative memory 1 while the network address of the network device 400-2 in FIG. 11 corresponding thereto is stored in the first word of the memory 404. Similarly, the network address of the network device 400-3, the network address of the network device 400-4, the network address of the network device 400-5, and the network address of the network device 400-6 are stored in the second word, the third word, the fourth word, and fifth word of the memory 404, respectively. Supplied with the memory address signal 403 as a read address, the memory 404 supplies a memory data signal 405 stored in the word designated by the memory address signal 403 to the transfer network address changing section 407. Herein, it goes without saying that the encoder 402 can be eliminated by directly supplying the state of the match lines 11-1 through 11-$m$ to the word lines of the memory 404.

Upon changing the second transfer network address 414 of the output transfer data 409 into the value of the memory data signal 405, the transfer network address changing section 407 transfers the value to the network device or the user's terminal corresponding to the second transfer network address 414.

Next, description will be made about the operation of the network device 400 when applied to the network device 400-1 in FIG. 11 taking an example of the communication data transfer from the user's terminal 401-1 to a user's terminal 401-3. If the network address is represented in octal numbers notation, the source network address 410 and the destination network address 412 of the input transfer data 408 are therefore represented as (1.2.6) and (2.6.5), respectively, and as a matter of course, the transfer network address 411 is the network address of network device 400-1.

Upon supplying said input transfer data 408 to the network device 400-1, the destination network address extracting section 406 delivers the value (2.6.5) in octal numbers notation of the destination network address 412 to the associative memory 1 as the search data 10.

The associative memory 4 for primary searching operation in the associative memory 1 carries out the primary searching operation for said search data 10 given by (2.6.5) in octal numbers notation, so that the primary associative memory word 7-1 and 7-5 are coincident with the search 10 data, and the primary match lines 13-1 and 13-5 are then put into a valid state. In the meanwhile, the associative memory 4 for primary searching operation performs a logical sum operation, with a valid state for the storage data as true, of all coincident storage data, and produces "010.110.000" in binary numbers notation to the counting means 17 as the nine-bit intermediate data 15 as mentioned above. The counting means 17 converts the nine-bit intermediate data 15 into the four-bit secondary search data 19 of "0100" in binary numbers notation according to Table 1 to supply to the first to fifth words four-bit associative memory 3 for secondary searching operation. The associative memory 3 for secondary searching operation carries out the secondary searching operation for the secondary search data 19, so that the secondary associative memory words 9-3 and 9-5 are coincident with the search data 19, and the secondary match lines 21-3 and 21-5 are then put into a valid state. When the corresponding primary match lines 13-1 through 13-5 are in an invalid state, the invalidation means 22 changes the secondary match lines 21-1 through 21-5 into an invalid state to thereby supply to the match lines 11-1 through 11-5. The invalidation means 22 therefore puts only the match line 11-5 into a valid state.

Therefore, the encoder 402 produces "5" as the memory address signal 403, and the memory 404 produces the network address for the network device 400-6 as the memory data signal 405. The transfer network address changing section 407 changes the second transfer network address 414 of the output transfer data 409 into the state of the memory data signal 405, and transfers the output transfer data 409 to the network device 400-6. It will therefore be understood that the network device 400 can carry out the transmission by means of selecting most optimum route to the destination network address 412.

Since the network device 400 of the present invention comprises the associative memory 1 of the present invention, although it can carry out the calculation of the transfer network address for every clock, the power consumption can be significantly reduced as compared with the conventional network device. Since small power unit, cooling apparatus, or the like in size can be used, the product cost as the whole network device can be reduced without sacrificing a transfer rate.

Further, when the conventional associative memory 100 and associative memory 1 of the present invention have the same chip area, the number of associative memory 1 incorporated into the network device 400 can be reduced with an increase in the number of the storing words of the structured data per chip Therefore, the computer network system using the network device 400 of the present invention can accelerate the data transfer rate, since comparing processes to a results of the searching operation supplied from a plurality of the associative memories are not required.

INDUSTRIAL AVAILABILITY

Since the associative memory of the present invention comprises: the counting means of generating the secondary search data by carrying out the operation for compressing the bit width to the intermediate data calculated by utilizing the result of the primary searching operation which compares the search data supplied from the external source with the stored storage data taking the mask information into account; the secondary searching means of comparing the secondary storage data corresponding to said storage data and said mask information with said secondary search data and the invalidation means of invalidating the comparison result of the secondary searching means corresponding to the incoincident storage data from the result of the primary searching operation, as described above, while the associative memory can perform the operation to produce the signal for identifying, among the storage data coincident with the search data, particular storage data corresponding to the mask information with the least number of bits in a valid state for every clock, the chip area can be significantly reduced as compared with the conventional associative memory. When the search data comprises, for example the 64-bit width, the chip area can be reduced about 31% as compared with the conventional associative memory. In other words, having the same chip area as that of the conventional associative memory, the associative memory of the present invention can increase in the storage capacity by about 42%. Since the larger the bit width of the search data becomes, the larger the circuit area reduction effect of the present invention becomes, when applied to the next-generation Internet, or the like in which the bit width of the network address will be expanded to 128 bits from 32 bits, the associative memory of the present invention will exert a remarkable effect.

Further, while the associative memory of the present invention can perform the operation to produce the signal for identifying, among the storage data coincident with the search data, particular storage data corresponding to the mask information with the least number of bits in a valid state for every clock, the power consumption can be reducible about 50% as compared with the conventional associative memory.

Furthermore, if the associative memory of the present invention is incorporated into the network device for calculating the transfer network address, it becomes possible to use small-scale power unit and cooling apparatus, and thereby the superior effect such as the product cost reduction as the whole network device can be achieved because the power consumption is reduced as compared with the conventional associative memory.

As will be understood from the foregoing, the network system using the associative memory of the present invention can accelerate the data transfer rate, because the computer network system using the associative memory of the present invention does not require comparing to the results of the searching operation supplied from a plurality of the associative memory by reducing the number of the associative memory incorporated therein.

What is claimed is:

1. A network system for communicating data between communication devices connected to a network through a network device, the network device comprising a routing information table incorporating a plurality of words therein, each word storing a routing information data and a mask information data corresponding to each one or more routing information data, the mask information data determining whether or not each bit string of the routing information data should be excluded as a retrieval data by setting a bit state;

the network device further comprising:

a CPU and a memory;

a primary retrieval means for comparing each word of a destination network address in an input communication data with each word of the routing information data being masked by the mask information data to identify a matching word, wherein the destination network address is input as a primary retrieval data, outputting a primary match signal identifying a matching word, and outputting logical operation results among the routing information data being masked by the mask information data in a matching word as an intermediate data;

a compressive operation means for compressing a bit width of the intermediate data to generate a secondary retrieval data;

a secondary retrieval means for storing second storage data in a manner to correspond to each word of the routing information data, the second storage data being derived by compressing each word of the routing information data, the secondary retrieval means comparing each word of the secondary retrieval data with each word of the second storage data and outputting a secondary match signal identifying a matching word;

an invalidation means for generating a final match signal for each word by altering the secondary match signal for each word corresponding to the primary match signal for each word to be in a mismatch state; and a means for deciding a transfer address to output a communication data corresponding to the input communication data in accordance with the final match signal.

2. A network system for communicating data between communication devices connected to a network through a network device, the network device comprising a routing information table incorporating a plurality of words therein, each word storing a routing information data and a mask information data in pairs, the mask information data determining whether or not each bit string of the routing information data should be excluded as a retrieval data by setting a bit state;

the network device further comprising:

a CPU and a memory;

a primary retrieval means for comparing each word of a destination network address in an input communication data with each word of the routing information data being masked by the mask information data, outputting a primary match signal identifying a matching word, wherein the destination network address is input as a primary retrieval data, and outputting logical operation results among the mask information data and the primary retrieval data in a matching word as an intermediate data;

a compressive operation means for compressing a bit width of the intermediate data to generate a secondary retrieval data;

a secondary retrieval means for storing second storage data in a manner to correspond to each word of the routing information data, the second storage data being derived by compressing each word of the routing information data, the secondary retrieval means comparing each word of the secondary retrieval data with each word of the second storage data and outputting a secondary match signal identifying a matching word;

an invalidation means for generating a final match signal for each word by altering the secondary match signal for each word corresponding to the primary match signal for each word to be in a mismatch state; and a means for deciding a transfer address to output a communication data corresponding to the input communication data in accordance with the final match signal.

3. A network system for communication data between communication devices connected to a network through a network device, the network device comprising a routing information table incorporating a plurality of words therein, each word storing a routing information data and a mask information data determining whether or not each bit string of the routing information data should be excluded as a retrieval data by setting a bit state;

the network device further comprising:

a CPU and memory;

a primary retrieval means for comparing each word of a destination network address in an input communication data with each word of the routing information data being masked by the mask information data, outputting a primary match signal identifying a matching word, wherein the destination network address is input as a primary retrieval data, and outputting logical operation results among the mask information data in a matching word as an intermediate data;

a compressive operation means for compressing a bit width of the intermediate data to generate a secondary retrieval data;

a secondary retrieval means for storing second storage data in a manner to correspond to each word of the routing information data, the second storage data being derived by compressing each word of the mask information data, the secondary retrieval means comparing each word of the secondary retrieval data with each word of the second storage data and outputting a secondary match signal identifying a matching word;

an invalidation means for generating a final match signal for each word by altering the secondary match signal for each word corresponding to the primary match signal for each word to be in a mismatch state; and a means for deciding a transfer address to output a communication data corresponding to the input communication data in accordance with the final match signal.

4. A method for communicating data between communication devices connected to a network through a network device, the method comprising;

deciding a transfer address of the network device comprising a routing information table incorporating a plurality of words therein, each word storing a routing information data and a mask information data corresponding to each one or more routing information data, the mask information data determining whether or not each bit string of the routing information data should be excluded as a retrieval data by setting a bit state;

when a destination network address is input as a primary retrieval data, performing, by the network device, a primary retrieval for comparing each word of the destination network address with each word of the routing information data being masked by the mask information data to generate logical operation results among the routing information data being masked by the mask information data in a matching word as an intermediate data;

performing, by the network device, a logical operation for compressing a bit width of the intermediate data to generate a secondary retrieval data;

performing, by the network device, a secondary retrieval for comparing a logical operation results for each word with each word of the secondary retrieval data, the logical operation results being derived by compressing the routing information data in the one or more words matched in the primary retrieval; and deciding, by the network device, a transfer address of an output communication data corresponding to the input communication data in accordance with the muting information data corresponding to the word matched in the secondary retrieval.

5. A method for communicating data between communication devices connected to a network through a network device, the method comprising;

deciding a destination address comprising a routing information table incorporating a plurality of words therein, each word storing a routing information data and a mask information data in pairs, the mask information data determining whether or not each bit string of the routing information data should be excluded as a retrieval data by setting a bit state;

when a destination network address is input as a primary retrieval data, performing, by the network device, a primary retrieval for comparing each word of the destination network address with each word of the routing information data being masked by the mask information data to generate logical operation results among the mask information data and the primary retrieval data in a matching word as an intermediate data;

performing, by the network device, a logical operation for compressing a bit width of the intermediate data to generate a secondary retrieval data;

performing, by the network device, a secondary retrieval for comparing a logical operation results for each word with each word of the secondary retrieval data, the logical operation results being derived by compressing the routing information data in the one or more words matched in the primary retrieval; and deciding, by the network device, a transfer address of an output communication data corresponding to the input communication data in accordance with the routing information data corresponding to the word matched in the secondary retrieval.

6. A method for communicating data between communication devices connected to a network through a network device, the method comprising;

deciding a destination address comprising a routing information table incorporating a plurality of words therein, each word storing a routing information data and a mask information data in pairs, the mask information data determining whether or not each bit string of the routing information data should be excluded as a retrieval data by setting a bit state;

when a destination network address is input as a primary retrieval data, performing, by the network device, a primary retrieval for comparing each word of the destination network address with each word of the routing information data being masked by the mask information data to generate logical operation results among the mask information data in a matching word as an intermediate data;

performing, by the network device, a logical operation for compressing a bit width of the intermediate data to generate a secondary retrieval data;

performing, by the network device, a secondary retrieval for comparing a logical operation results for each word with each word of the secondary retrieval data, the logical operation results being derived by compressing the routing information data in the one or more words matched in the primary retrieval; and deciding, by the network device, a transfer address of an output communication data corresponding to the input communication data in accordance with the routing information data corresponding to the word matched in the secondary retrieval.

* * * * *